(12) United States Patent
Franz et al.

(10) Patent No.: US 11,785,743 B2
(45) Date of Patent: Oct. 10, 2023

(54) TEMPERATURE CONTROL OF CLOSELY PACKED ELECTRONIC ASSEMBLIES

(71) Applicant: HEWLETT PACKARD ENTERPRISE DEVELOPMENT LP, Houston, TX (US)

(72) Inventors: John Franz, Houston, TX (US); Ernesto Ferrer, Aguadilla, PR (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 113 days.

(21) Appl. No.: 17/237,732

(22) Filed: Apr. 22, 2021

(65) Prior Publication Data

US 2022/0369513 A1    Nov. 17, 2022

(51) Int. Cl.
*H05K 7/20* (2006.01)
*H05K 1/02* (2006.01)
*H05K 5/02* (2006.01)

(52) U.S. Cl.
CPC ....... *H05K 7/20336* (2013.01); *H05K 1/0201* (2013.01); *H05K 5/0213* (2013.01); *H05K 7/20327* (2013.01)

(58) Field of Classification Search
CPC ............. H05K 7/20336; H05K 1/0201; H05K 5/0213; H05K 7/20327
USPC ......................................................... 361/688
See application file for complete search history.

(56) References Cited

U.S. PATENT DOCUMENTS

| | | | | |
|---|---|---|---|---|
| 4,994,937 A | * | 2/1991 | Morrison | H05K 7/1409 361/720 |
| 5,057,968 A | * | 10/1991 | Morrison | H05K 7/20936 361/802 |
| 6,807,056 B2 | * | 10/2004 | Kondo | H05K 7/20781 361/689 |
| 7,254,030 B2 | * | 8/2007 | Chiba | H01L 23/473 361/710 |
| 7,675,748 B2 | * | 3/2010 | Matsushima | G11B 33/1426 361/699 |
| 7,933,125 B2 | * | 4/2011 | Wei | H05K 7/20772 361/708 |

(Continued)

OTHER PUBLICATIONS

Lenovo, "ThinkSystem SD650 Direct Water Cooled Server (Xeon SP Gen 1)," Product Guide (withdrawn product), Jul. 23, 2019, 38 pages, https://lenovopress.com/lp0636-thinksystem-sd650-direct-water-cooled-server-xeon-sp-gen-1.

*Primary Examiner* — Anatoly Vortman
(74) *Attorney, Agent, or Firm* — Nolte Lackenbach Siegel

(57) ABSTRACT

A thin, single-layer thermally conductive jacket surrounds a PCA. One or more living springs integrated in the jacket exert compressive force on PCA components where cooling is desired. The compressive force creates and maintains a thermal contact though which heat is conducted out of the PCA components and into the jacket. The jacket conducts the heat (either directly or indirectly) to a liquid-cooled cold plate configured as a cooling frame surrounding one or more of the jacketed PCAs. The jacket, optionally through intermediate thermal transfer devices such as heat spreaders or heat pipes, transfers heat from components on the PCA to the cooling frame. Liquid flowing through the cooling frame's internal channels convects the heat out of the electronic device. Turbulence encouraged by turbulence enhancing artifacts including bends and shape-changes along the internal channels increases the efficiency of the convection.

20 Claims, 15 Drawing Sheets

(56) References Cited

U.S. PATENT DOCUMENTS

| | | | |
|---|---|---|---|
| 7,957,132 B2 | 6/2011 | Fried | |
| 7,965,508 B2* | 6/2011 | Yamamoto | H01L 25/117 174/15.1 |
| 8,004,841 B2* | 8/2011 | Cipolla | F28D 15/0233 174/15.1 |
| 8,081,473 B2* | 12/2011 | Cipolla | H01L 23/473 361/679.52 |
| 8,526,184 B2* | 9/2013 | Sullivan | H05K 7/20127 361/721 |
| 8,587,943 B2 | 11/2013 | Barina et al. | |
| 8,638,559 B2 | 1/2014 | Barina et al. | |
| 8,659,897 B2* | 2/2014 | Meijer | G06F 1/20 361/721 |
| 9,158,348 B2* | 10/2015 | Berk | G06F 1/20 |
| 9,245,820 B2 | 1/2016 | Goldrian et al. | |
| 10,602,640 B1* | 3/2020 | Tsai | H05K 7/20254 |
| 11,301,008 B2* | 4/2022 | Adami | G06F 1/203 |
| 2006/0250772 A1* | 11/2006 | Salmonson | G06F 1/20 361/698 |
| 2008/0007913 A1* | 1/2008 | Sullivan | H05K 7/20636 361/699 |
| 2008/0062652 A1* | 3/2008 | Lieberman | H01L 23/427 361/715 |
| 2008/0084668 A1* | 4/2008 | Campbell | H05K 7/20509 257/E23.098 |
| 2009/0034327 A1* | 2/2009 | Yun | H05K 1/0209 361/689 |
| 2009/0277616 A1* | 11/2009 | Cipolla | H01L 23/473 165/104.33 |
| 2010/0025010 A1* | 2/2010 | Cipolla | H01L 23/4093 165/47 |
| 2010/0085712 A1* | 4/2010 | Hrehor, Jr. | H05K 7/20254 361/699 |
| 2010/0091447 A1* | 4/2010 | Jaggers | H05K 7/20254 361/679.47 |
| 2011/0058335 A1* | 3/2011 | Sullivan | H05K 7/20709 361/704 |
| 2014/0002980 A1 | 1/2014 | Berk et al. | |
| 2018/0018001 A1* | 1/2018 | Franz | G06F 1/20 |
| 2020/0163253 A1 | 5/2020 | Lunsman et al. | |
| 2022/0369513 A1* | 11/2022 | Franz | H05K 7/20336 |

* cited by examiner

TEMPERATURE CONTROL OF CLOSELY PACKED ELECTRONIC ASSEMBLIES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND

Many electronic components are designed to perform within a range of temperatures defined in a temperature specification. More particularly, operating temperature affects the operability and efficiency of computing devices. Excessive heat often degrades real-time performance of electronic components. Such heat may also fatigue component materials over time, which in turn may shorten the useful life of the hardware. In large or powerful computing devices, that may have high densities of heat generating electronic components, heat disposal and cooling of those electronic components are therefore areas of focus. As the art advances, electronic devices continue to be deployed in greater numbers and in greater densities. This type of implementation may generally exacerbate concerns over (and difficulties with) maintaining operating temperatures within the design specification range.

BRIEF DESCRIPTION OF THE DRAWINGS

The presently disclosed technique may be understood by reference to the following description taken in conjunction with the accompanying drawings, in which like reference numerals identify like elements, and in which.

Figure 1:
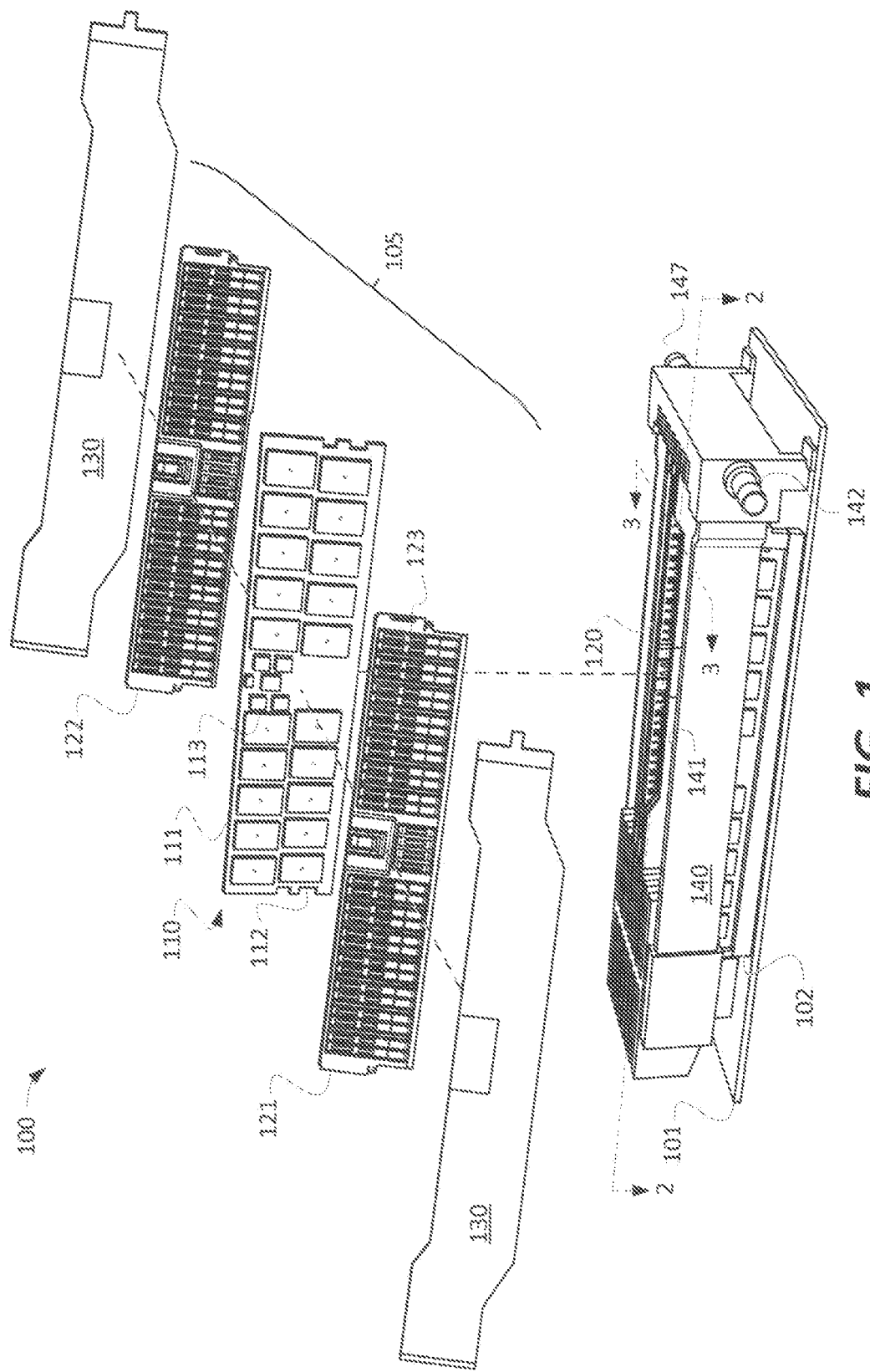
FIG. 1 is an exploded perspective assembly view of a liquid cooling system for a printed circuit assembly.

While the techniques disclosed herein is susceptible to various modifications and alternative forms, the drawings illustrate specific examples herein described in detail by way of example. It should be understood, however, that the description herein of specific examples is not intended to limit the disclosed technique to the particular forms disclosed, but on the contrary, the intention is to cover all modifications, equivalents, and alternatives falling within the spirit and scope of the appended claims.

DETAILED DESCRIPTION

Illustrative examples of the subject matter claimed below are disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

As used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Market demand continues to drive development of electronic devices with increased capabilities and decreased size. The increased capabilities may be provided by integrated circuits ("ICs") that consume more power than previous ICs such that they perform more high-speed functions simultaneously. The decreased size may be achieved by packing multiple ICs closer together on printed circuit assemblies ("PCAs") and by positioning neighboring PCAs closer together inside device housings or enclosures. This decrease in size and closer orientation are both examples of increased density of components. As a result of each of higher power consumption and closer spacing there is likely to be an increase in the heat generated during operation.

Heat may be transferred away from an undesired location by conduction through a solid or a fluid, convection by a fluid (i.e., liquid or gas), or heat radiation. Alternatively, heat may be absorbed by endothermic chemical reactions such as certain phase changes. Many approaches to cooling and heat disposal for computing systems have been tried, and continue to be developed, using these principles (either individually or in coordination with each other).

In general, removal arrangements for problematic concentrations of heat occupy at least some space. Space is in increasingly short supply in today's computing systems (e.g., due to the above-referenced general increase in density of components). In addition to the total amount of available space around PCAs, the location and shape of that space may also present challenges. Much of the PCA space that is not occupied by ICs or other electrical components may be reserved as one or more "keepouts." In general, keepouts may be used to accommodate fasteners, stiffening features of the housing, routing of card cables, ranges of motion for moving parts, clearance for test probes, and other design goals that may compete with temperature-control measures for space. Therefore, as electronic devices change, previous temperature-control approaches may become ineffective or obsolete, thereby necessitating new advances in the field.

This disclosure describes examples of cooling systems that combine solid-state conduction with fluid convection to cool closely-spaced components (ICs and other parts such as inductors) mounted to PCAs that may themselves be arranged in high density groups. In some disclosed examples, a thin, single-layer thermally conductive jacket surrounds each PCA. One or more living springs may be integrated in the jacket, in part, to exert compressive force on PCA components where cooling is desired. The compressive force may create and maintain a thermal contact though which heat may be conducted out of the PCA components and into the jacket. The jacket may then conduct the heat (either directly or indirectly) to a liquid-cooled cold plate configured as a cooling frame. In some examples, this cooling frame surrounds one or more of the jacketed PCAs.

The jacket, optionally, through intermediate thermal transfer devices such as heat spreaders or heat pipes, may then transfer heat from components on the PCA to the cooling frame. Liquid flowing through internal channels of the cooling frame may then assist in transferring the heat out of the electronic device. In some systems, coolant may flow with minimal turbulence within the fluid. However, in disclosed implementations, turbulence may be encouraged or enhanced by using "turbulence enhancing artifacts." Turbulence enhancing artifacts, as referenced herein, are "intentionally designed" bends and shape-changes along the internal channels. It has been found that this increased turbulence may improve the efficiency of the convection.

In some examples, a thermal transfer assembly, includes a thermal transfer jacket and a cooling frame with which the thermal transfer jacket is mechanically engaged and to which the thermal transfer jacket is thermally coupled. The cooling frame defines an interior framed space into which at least a portion of the thermal transfer jacket is disposed. The interior framed space may also define a coolant channel including turbulence enhancing artifacts to intentionally introduce turbulence into a liquid flow through the coolant channel.

In other examples, a compute subassembly includes a printed circuit assembly and a thermal transfer assembly. The printed circuit assembly includes a printed circuit board and a plurality of electronic components mounted to the printed circuit board. The thermal transfer assembly includes a thermal transfer jacket and a cooling frame. The thermal transfer jacket encases and mechanically engages the printed circuit assembly and is thermally coupled to the printed circuit assembly. The thermal transfer jacket is also mechanically engaged to the cooling frame. The cooling frame is also thermally coupled to the thermal transfer jacket and the printed circuit assembly. The cooling frame furthermore defines an interior framed space into which at least a portion of the thermal transfer jacket is disposed and a coolant channel including turbulence enhancing artifacts designed to intentionally introduce turbulence into a liquid flow through the coolant channel.

In still other examples, a compute system, includes a first printed circuit board and a compute subassembly. The compute subassembly includes a cooling frame mounted to the first printed circuit board. The cooling frame defines an interior framed space and a coolant channel including turbulence enhancing artifacts to intentionally introduce turbulence into a liquid flow through the coolant channel. The compute subassembly further includes a plurality of jacketed printed circuit assemblies. Each jacketed printed assembly is at least partially disposed in the interior framed space; is mechanically and electrically engaged to the first printed circuit board within the interior framed space; and is thermally coupled to the coolant channel.

Turning now to the drawings, FIG. 1 is an exploded perspective assembly view of a liquid cooling system for a printed circuit assembly ("PCA") in the context of a part of a compute system 100. The compute system 100 may in itself be a computer or may be a part of a computer. As used herein, a "computer" is any electronic device that includes a processor and that is capable of executing programs comprising machine-readable instructions, including, for example, a server, a converged (or hyperconverged) appliance, a rack-scale system, some storage arrays, etc.

The compute system 100 includes a first printed circuit board ("PCB") 101 and at least one electronic socket 102 (best shown in FIG. 3) whose function will be discussed further below. The compute system 100 also includes a compute subassembly comprised of a cooling frame 140 and one or more jacketed printed circuit assemblies ("PCAs") 105. In the illustrated example, one jacketed PCA 105 is shown in an exploded view, itself being disassembled from the rest of the compute system 100. Additional jacketed PCAs 105 (not separately indicated) are shown assembled into the compute system 100.

Those in the art having the benefit of this disclosure will appreciate that the compute system 100 may include many other components and features other than what is shown. For instance, the compute system 100 may include a power subsystem for providing power, a cooling subsystem delivering and receiving coolant, and processor-based controllers for various purposes, and/or other components. These other components and features are omitted for the sake of clarity and so as not to obscure the subject matter claimed below.

The jacketed PCA 105 includes a PCA 110 comprised of a second printed circuit board 111 on which are mounted a plurality of electronic components 112, 113. In the illustrated example, the PCA 110 is a memory board and the electronic components 112, 113 are memory modules and capacitors, respectively. More particularly, the memory modules 112 are Dual In-line Memory Modules ("DIMMs"). Note that in other examples the memory modules may be some kind of memory module other than a DIMM. The PCA 110 may also include other kinds of electronic components in addition to or instead of the memory modules 112 and the capacitors 113.

For instance, the PCA 110 may also include inductors (not shown), voltage regulators (also not shown), controllers (again not shown) and the like. In some examples the PCA 110 may be a processor board. In these examples, the electronic components may be processors or other kinds of electronic components that are used to implement the functionality of the processor board. Some examples employing a plurality of jacketed PCAs 105 may include jacketed PCAs 105 in which the constituent PCAs 110 perform different functions. In such an example, one or more of the jacketed PCAs 105 may include a PCA 110 that is a memory board and one or more of the jacketed PCAs 105 may include a PCA 110 that is a processor board.

The jacketed PCA 105 furthermore includes a thermal transfer jacket comprised of, in the illustrated example, a first cover 121 and a second cover 122. The first cover 121 and second cover 122 each include a plurality of living springs 123 whose form and function are described more fully below relative to FIGS. 4A-6B. In the illustrated example, the first cover 121 and the second cover 122 are each formed from a single layer of material having a thermal conductivity of at least 350 W/m/K and a thickness of at most 0.25 mm. However, other examples may use more than one layer of material provided that spacing specifications are met, materials having different thermal conductivities, and materials having different thicknesses.

The first cover 121 and the second cover 122 oppose one another to mechanically engage in a manner described more fully below to encase the PCA 110. The first cover 121 then covers at least a first portion of a first side of the PCA 110 and the second cover 122 covers at least a second portion of the second side of the PCA 110. When encasing the PCA 110, the thermal transfer jacket mechanically engages with and thermally couples to the PCA 110.

As used herein, to "thermally couple" two objects means to provide a thermally conductive pathway between the objects that allows heat to be conducted between the objects. Two objects may be considered to be thermally coupled if any of the following are true: (1) the two objects are in contact with one another (either direct contact, or contact via a thermal interface material ("TIM")), (2) the objects are both thermally coupled to a thermal transfer device (or to a chain of thermally coupled thermal transfer devices), or (3) a heat transfer coefficient between the two objects is 10 $W \cdot m^{-2} \cdot K^{-1}$ or greater. A TIM may be a relatively thin, thermally conductive, and compliant (easily deformable) material placed between two devices at their thermal interface to improve heat transfer rates by filling air gaps that would otherwise occur between the devices due to surface roughness and/or misalignment. Common examples of a TIM include thermal gap pads, thermal grease, thermal paste.

The example of FIG. 1 also includes a pair of optional thermal transfer devices 130. The thermal transfer devices 130, when used, assist in thermal transfer from the jacketed PCA 105 to the cooling frame 140. Additional details regarding the thermal transfer device 130 are provided below relative to FIGS. 14A-14D. In the illustrated example, the thermal transfer device 130 is a heat spreader but other kinds of thermal transfer devices may be used in other examples. Some examples may omit the thermal transfer devices altogether. Several such examples are discussed below.

Figure 13A:
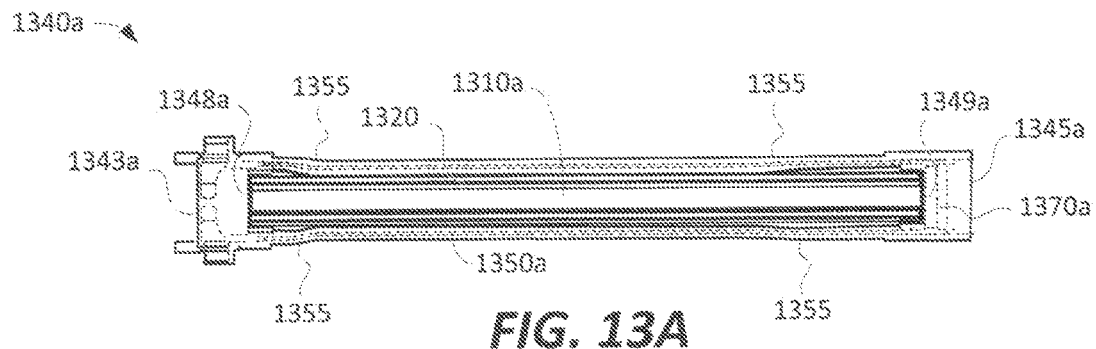
FIG. 13A is a top assembly view of a cooling frame and jacket for a single high-powered PCA.
Figure 13B:
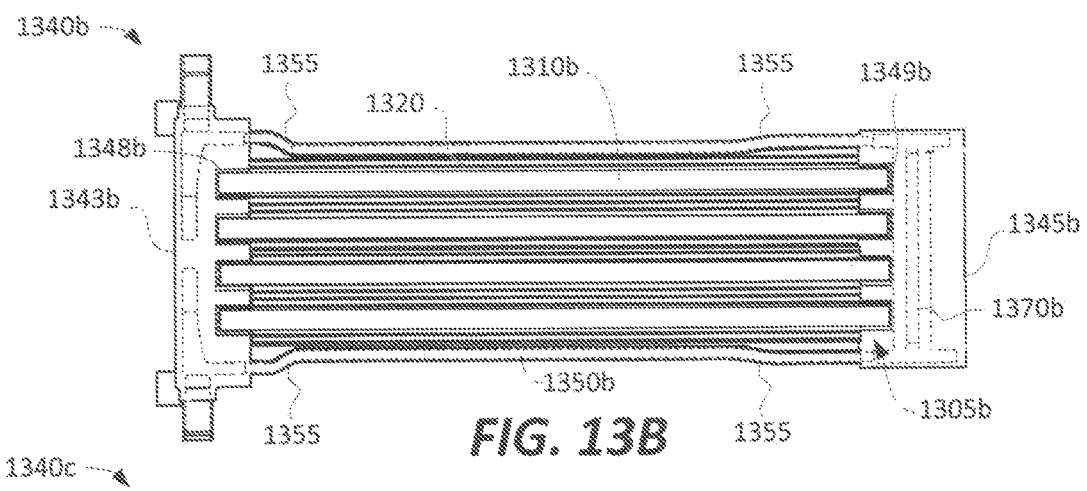
FIG. 13B is a top, assembly view of a cooling frame for a bank of moderately high-powered, closely spaced, jacketed PCAs with no thermal transfer devices.
Figure 13C:
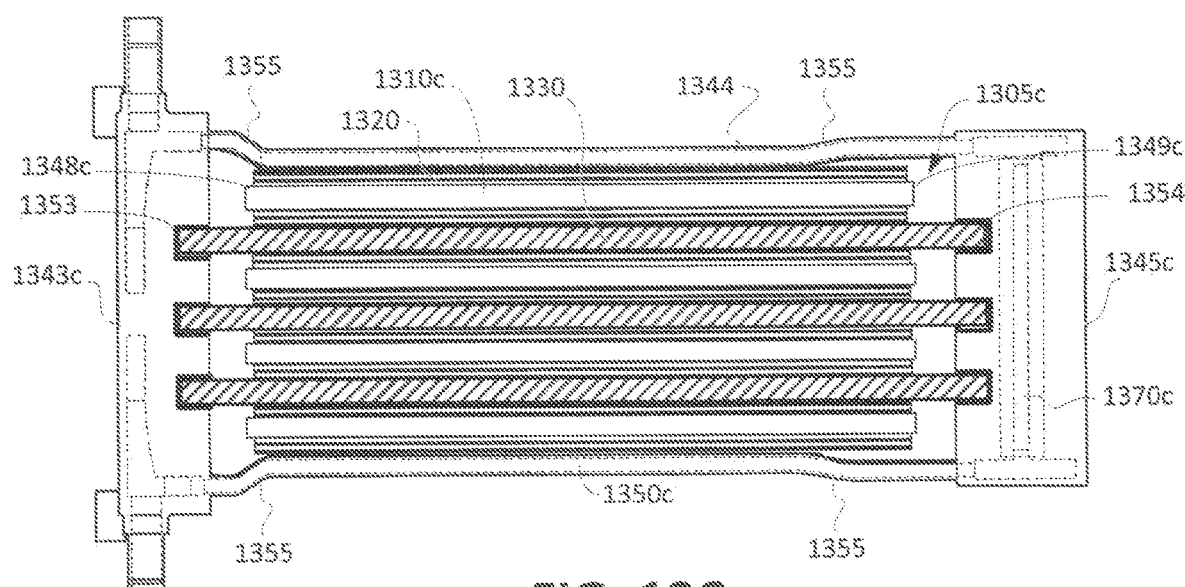
FIG. 13C is a top, assembly view of a cooling frame and jackets for a bank of lower-powered, very closely spaced, PCAs.

As will be described in further detail below, the thermal transfer devices 130 are thermally coupled and mechanically engaged with the jacketed PCA 105 without being mechanically fastened or otherwise affixed to the jacketed PCA 105. The cooling frame 140 defines respective mounting slots for the thermal transfer devices 130 and the jacketed PCA(s) 105 in examples where thermal transfer devices 130 are used, although this is not shown in FIG. 1. However, this is shown in FIG. 13C and discussed relative thereto.

A "thermal transfer device" may be any device that is thermally conductive and that is configured to receive heat from one solid body via conduction (contact) and transfer the heat into a second solid body via conduction (contact). Examples of thermal transfer devices include, but are not limited to, heat pipes, vapor chambers, heat spreaders (such as solid bars or strips of metal), cooling tubes, etc. A "heat pipe" refers to a specific type of thermal transfer device that includes a case (vessel) having walls that surround a sealed interior channel containing a working fluid and a wick such that the fluid transfers heat between different regions of the device by a cycle of vaporization and condensation.

Returning to FIG. 1, the compute system 100 also includes the cooling frame 140. The cooling frame 140 mechanically engages the first printed circuit board 101. The first printed circuit board 101 may be referred to as a "host board" in the sense that it "hosts" the jacketed PCAs 105. The mechanical engagement of the cooling frame 110 to the first printed circuit board 101 may be implemented using any suitable technique known to the art. Some examples may affix the cooling frame 140 to the first printed circuit board 101 using fasteners (not shown) such as screws. Other examples might affix the cooling frame 140 to the first printed circuit board 101 by bonding or adhering. Still other examples may use other techniques.

The cooling frame 140 defines at least one PCA slot 120 and an interior frame space 141. The interior frame space 141 is, in the illustrated example, generally rectangular in shape as is the cooling frame 140. Other examples not illustrated may employ other geometries for the exterior contour of the cooling frame 140 and the interior frame space 141. Similarly, in some examples, the geometry of the external contours of the cooling frame 140 may differ from that of the interior framed space 141. The interior frame space 141 encompasses the electronic sockets 102 on the first printed circuit board 101. The electronic sockets 102 are a part of the PCA slots(s) 120 as discussed further below and the jacketed PCAs 105 align with the electronic socket(s) 102 in the PCA slots 120.

The cooling frame 140 also defines a coolant channel including turbulence enhancing artifacts that intentionally introduce turbulence into a liquid flow through the coolant channel. The coolant channel is not shown in FIG. 1 and will be discussed in greater detail below relative to FIG. 2, FIG. 7, and FIGS. 9A-9B. In the example of FIG. 1, there is a first fitting 142 and a second fitting 147 through which liquid coolant respectively enters and exits the coolant channel. In the illustrated example, the first fitting 142 is fitted to the inlet (not shown) and the second fitting 147 is fitted to the outlet (also not shown). However, the functions of the inlet and outlet may be reversed in other examples not shown. Identification as inlets and outlets may be determined based on implementation specific considerations. Thus, in examples not shown, the first fitting 142 may be fitted to the outlet and the second fitting 147 may be fitted to the inlet.

Each of the thermal transfer devices 130, first covers 121, second covers 122, and cooling frame 140 are fabricated from one or more thermally conductive materials. The first cover 121 and second cover 122 are fabricated from a thermally conductive material. An object, device, or assembly (which may comprise multiple distinct bodies that are thermally coupled, and may include multiple different materials), is "thermally conductive" between two thermal interfaces for purposes of this disclosure if any one of the following is true: (1) a heat transfer coefficient between the thermal interfaces is 10 $W \cdot m^{-2} K^{-1}$ or greater at any temperature between 0° C. and 100° C., (2) the object is a continuous piece of a material that has a thermal conductivity (often denoted k, λ, or κ) between the two interfaces of 1 $W \cdot m^{-1} K^{-1}$ or greater at any temperature between 0° C. and 100° C., (3) the object is a heat pipe, vapor chamber, continuous body of copper, or continuous body of aluminum. Examples of materials whose thermal conductivity is greater than 1 $W \cdot m^{-1} K^{-1}$ between 0° C. and 100° C. include almost all metals and their alloys (e.g., copper, aluminum, gold, etc.), some plastics (e.g., TECACOMP® TC compounds, COOLPOLY® D-series Thermally Conductive Plastics), and many other materials.

The thermal transfer devices 130, first covers 121, second covers 122, and cooling frame 140 may all be fabricated from the same material or from different materials. For example, the cooling frame 140 may be fabricated by injection molding of a thermally conductive plastic while the thermal transfer device 130, first cover 121, and second cover 122 may be stamped from a sheet of metal or metal alloy, such as copper. Factors such as cost and weight may be considerations in material selection.

It will typically be desirable for at least some of these components, such as the thermal transfer device 130, first cover 121, and second cover 122, to be fabricated from one or more materials that are not only thermally conductive, but highly thermally conductive. An object, device, or assembly (which may comprise multiple distinct bodies that are thermally coupled, and may include multiple different materials), is "highly thermally conductive" as that term is used herein between two thermal interfaces if any one of the following is true: (1) a heat transfer coefficient between the thermal interfaces is 1000 $W \cdot m^{-2} K^{-1}$ or greater at any temperature between 0° C. and 100° C., (2) the object is a continuous piece of a material that has a thermal conductivity (often denoted k, λ, or κ) between the two interfaces of 100 $W \cdot m^{-1} K^{-1}$ or greater at any temperature between 0° C. and 100° C., (3) the object is a heat pipe, vapor chamber, continuous body of copper, or continuous body of aluminum. Examples of materials whose thermal conductivity is 100 $W \cdot m^{-1} K^{-1}$ or greater between 0° C. and 100° C. include certain types of copper, aluminum, silver, and gold.

Figure 2:
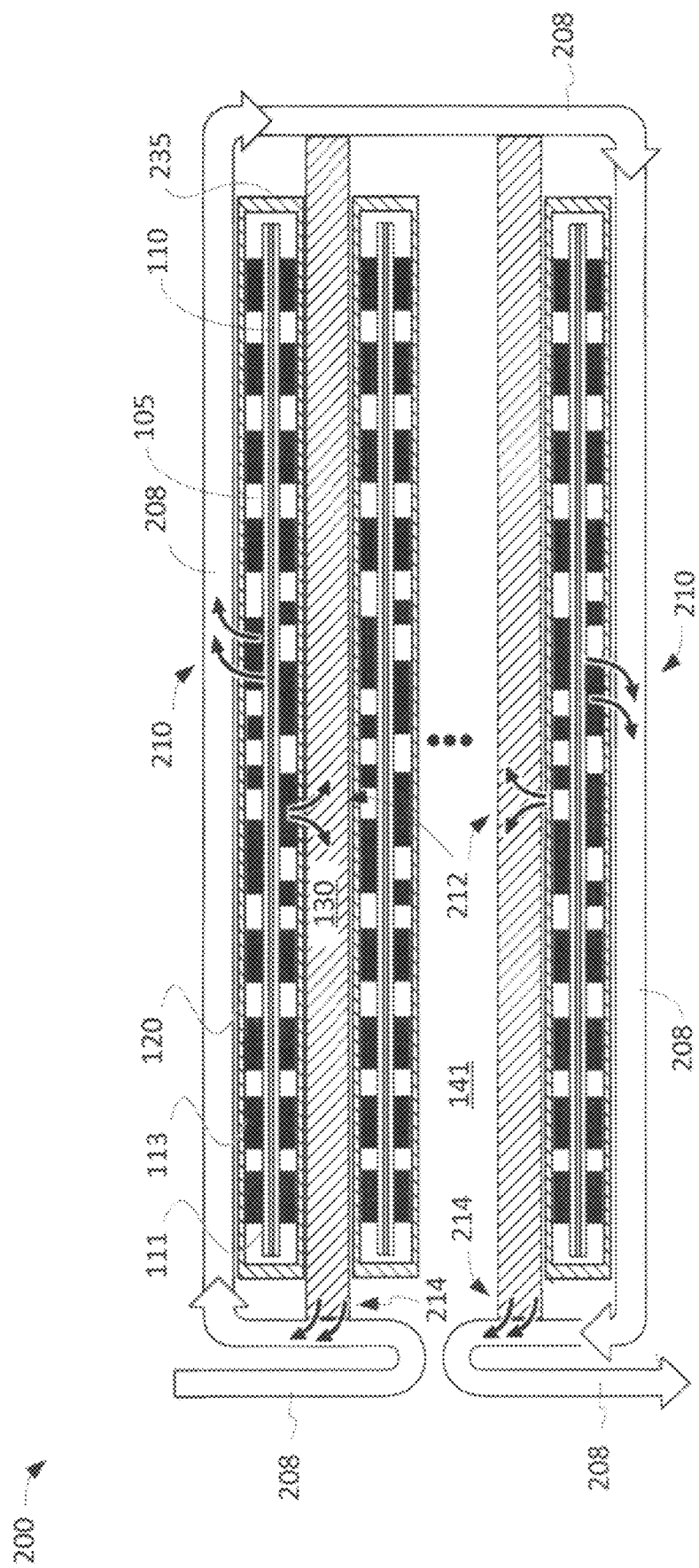
FIG. 2 is a schematic of the heat dissipation mechanisms used in the system of FIG. 1 in a partial cross-section taken along line 2-2 in FIG. 1.

FIG. 2 is a schematic representation 200 of the heat dissipation mechanisms used in the system of FIG. 1 with like parts bearing like numbers. FIG. 2 is a top, partially sectioned view taken along line 2-2 in FIG. 1. Again, some parts of the compute system 100—including some parts shown in FIG. 1—are not shown for the sake of clarity and so as not to obscure what is being discussed relative to FIG. 2. One such part is the cooling frame 140. Instead of the cooling frame 140, a schematic representation 200 of the coolant channel defined by the cooling frame 140 is shown.

The jacketed PCAs 105 (only one indicated) have been mounted to the first printed circuit board 101 (shown in FIG. 1) using the electronic sockets 102 (also shown in FIG. 1). As can be seen here, each thermal transfer jacket 235 (only one indicated) mechanically engages the PCA 110 (only one indicated) through direct physical contact with one or more of the electronic components 112, 113 (only one of each indicated). The physical contact also establishes a direct thermal coupling between the PCA 110 and the thermal transfer jacket 235.

Note also the relationship among the jacketed PCAs 105 and the thermal transfer devices 130 (only one indicated), which are mounted to the cooling frame 140 (shown in FIG. 1) in the manner described further below. In the illustrated example, the thermal transfer devices 130 are only positioned between the jacketed PCAs 105 and are not positioned between the jacketed PCAs 105 and the cooling frame 140. The thermal transfer devices 130 physically contact the thermal transfer jackets 235 as shown. Again, this physical contact establishes a mechanical engagement between the thermal transfer devices 130 and the thermal transfer jackets 235 but also a thermal coupling. Similarly, the direct physical contact between the thermal transfer devices 130 and the cooling frame 140 (shown in FIG. 1) also thermally couples the thermal transfer devices 130 to the cooling frame 140. However, the thermal transfer devices 130 are not affixed or attached in any way to the jacketed PCAs 105 in the examples shown herein.

The electronic components 112, 113 of the jacketed PCAs 105 are consequently thermally coupled to the cooling frame 140 (shown in FIG. 1) through the thermal transfer jackets 235 and/or the thermal transfer devices 130. The coolant flows through the coolant channel as indicated by the broad arrows 208. Because the cooling frame 140 is fabricated from a thermally conductive material, it transfers heat from the electronics 112, 113 into the coolant. Note that because of the direct physical contact with the walls of the coolant channel, the cooling frame 140 is thermally coupled to the coolant when the coolant circulates through the coolant channel.

More particularly, where the jacketed PCA 105 mechanically engages the cooling frame 104, heat from the electronic components 112, 113 transfers into the coolant as indicated by the arrows 210 through the thermal coupling provided by the thermal transfer jackets 235 and the cooling frame 140. Where the jacketed PCAs 105 physically engage a thermal transfer device 130, heat transfers from the heat from the electronic components 112, 113 into the thermal transfer device 130 as indicated by the arrows 212 through the thermal coupling provided by the thermal transfer jackets 235. The transferred heat then migrates through the thermal transfer device 130 to the ends where the thermal transfer device mechanically engages and thermally couples to the cooling frame 140. The heat then transfers into the coolant through the cooling frame as indicated by the arrows 214.

The coolant is circulated through the coolant channel under pressure from a closed loop cooling subsystem that is not shown. The coolant is heated as it circulates through the coolant channel, circulates away from the compute system 100 to be cooled, and then circulated again to the computer system 100. The heat generated by the electronic components 112, 113 is thereby managed and dissipated, permitting the compute system 100 to operate within specification to promote operability and efficiency of the compute system 100.

Figure 3:
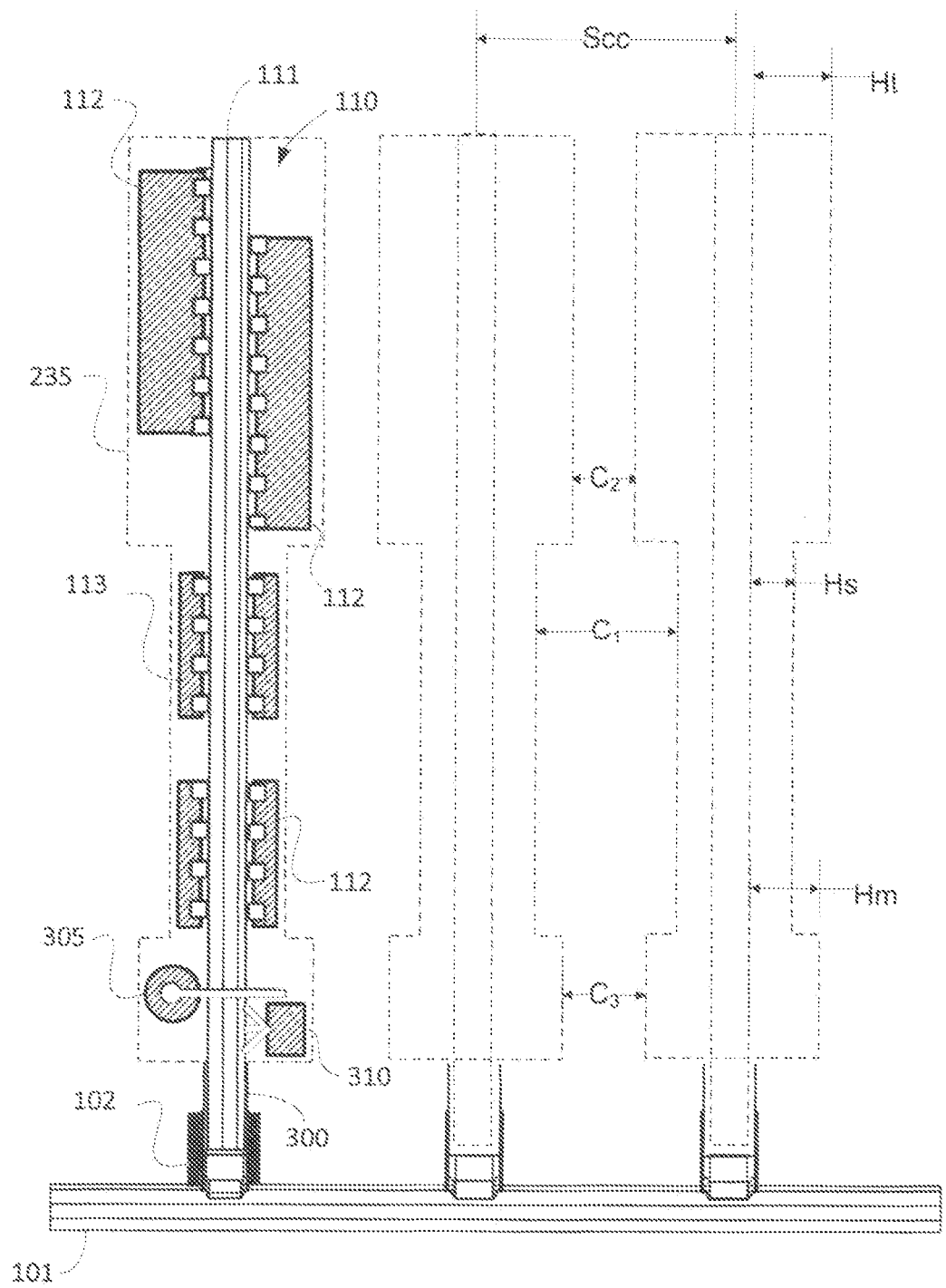
FIG. 3 is a sectioned end view of a printed circuit assembly and first printed circuit board taken along line 3-3 in FIG. 1 and showing the mechanical clearances for components that set thickness constraints for the PCA jacket.

The mechanical engagement of the jacketed PCAs 105 with the first printed circuit board 101 will now be described along with several aspects of the positioning of the PCAs 105. FIG. 3 is a sectioned end view of a printed circuit assembly and first printed circuit board taken along line 3-3 in FIG. 1. FIG. 3 also shows some of the mechanical clearances for components that set thickness constraints for the thermal transfer jacket in this particular example. Note, again, that some aspects of the compute system 100 are omitted in FIG. 3 for the sake of clarity. For instance, no thermal transfer devices 130 are shown.

The electronic sockets 102 are affixed to the first printed circuit board 101 in any suitable manner known to the art. The second printed circuit board 111 includes a plurality of edge connectors 300 such as, for instance, gold finger connectors. Other examples not shown may use other kinds of connectors. The edge connectors 300 are a part of the electrical circuitry (not shown) including the electronic components 112, 113 as well as other components of the PCA 110 by which the PCA 110 performs its intended function. To this end, as previously discussed, the PCA 110 may include electronic devices in addition to those already discussed, such as inductor 305 and thyristor 310. The electrical circuitry may be implemented using, for instance, surface traces and/or conductive layers of the first printed circuit board 101. Similarly, the electronic sockets 102 are a part of the electrical circuitry of the first printed circuit 101 that may be implemented using surface traces and/or conductive layers not shown.

The PCA 110 and, hence, the jacketed PCA 105, are mounted to the first printed circuit board 101 by inserting the edge connectors 300 into the electronic sockets 102. This insertion electrically connects the electrical circuitry (not shown) of the jacketed PCA 105 to the electrical circuitry of the first printed circuit board 101. Recall that, as disclosed above, the electronic sockets 102 are positioned within the interior framed space 141 first shown in FIG. 1. Thus, when assembled in this manner, the jacketed PCAs 105 are at least partially disposed within the interior framed space 141. As will be discussed below, the process of inserting the jacketed PCA 105 into the electronic sockets 102 is accompanied by insertion into a cooling frame slot (not yet shown) defined by the cooling frame 140.

Additional jacketed PCAs 105 are shown in broken lines to reflect assembly with the first printed circuit board 101 to illustrate certain dimensional features of the assembly. Arrays of closely spaced PCAs, such as DIMM banks, impose multiple constraints on the designs of temperature-control measures. The spaces between the PCAs, and between the PCA array and neighboring devices on the host board, may decrease with each generation of technology (e.g., as density increases). As well as being small in size, the spaces may be inconveniently shaped. Either size or shape constraints may preclude the adaptation of existing temperature-control approaches.

Still referring to FIG. 3, the sockets for the PCAs 110 have a center-to-center spacing $S_{cc}$ on the host board. $S_{cc}$ may be less than 9 mm, or less than 8 mm, 7 mm, or 6 mm. For example, $S_{cc}$ may be nominally 7.5+/−0.2 mm. The heights of components 112 on the PCAs 110 will occupy some of the space allotted by $S_{cc}$. The first printed circuit board 111 may have a thickness of, for instance, 0.78 mm, 1.57 mm, or 2.36 mm. Each side of the PCAs 110 may also have tall components that add $H_t$>2.5 mm to the width of the PCA 110. Examples of tall components include some integrated circuits ("ICs") such as power management ICs ("PMICs") as well as some non-chip electrical components such as capacitors and inductors. If tall components are mounted on both sides of a PCA 110 directly across from each other, the minimum clearance $C_2$ between outer surfaces of the PCAs 110 may be less than 2 mm, or even less than 1.5 mm, when the PCAs 110 are installed in the sockets 102.

If the temperature-control measures are to use solid-state elements in thermal contact with components 112, the tall components are not the only ones that constrain the temperature-control design. Solid-state temperature-control elements, such as thermal transfer devices, may preferably also make and maintain thermal contact with short components of height $H_s$<1.2 mm (for example, some types of memory chips) and components of medium height $H_m$~1.2-2.5 mm such as various small-outline ICs. The different heights of components 112 give rise to different clearances $C_1$ (maximum), $C_2$, (minimum), and, depending on the design, one or more intermediate clearances $C_3$ at different positions in the space between outer surfaces of the PCAs 110.

The variety of clearances and their locations may exclude some temperature-control design approaches. For example, if the minimum clearance $C_2$ occurs at the bottom of the PCA (nearest to the socket interface), and the maximum clearance $C_1$ is at the top, a tight-fitting conductive jacket, to be assembled separately and pushed down over the PCA(s) 110, may be straightforward to design and implement. If instead there are "overhangs" (taller components above shorter components), a "push-down" jacket design may be constrained by the need to make thermal contact with the short components lower on the PCA while avoiding stress to the tall components higher on the PCA during installation. Alternatives, such as hinged clamshells and two-part jackets that bring the thermal-transfer elements in laterally from opposite sides of the PCA, might perform more reliably for PCAs with overhangs because the tight-fitting sections for the short components would never be pushed or pulled over the tall components.

Figure 4A:
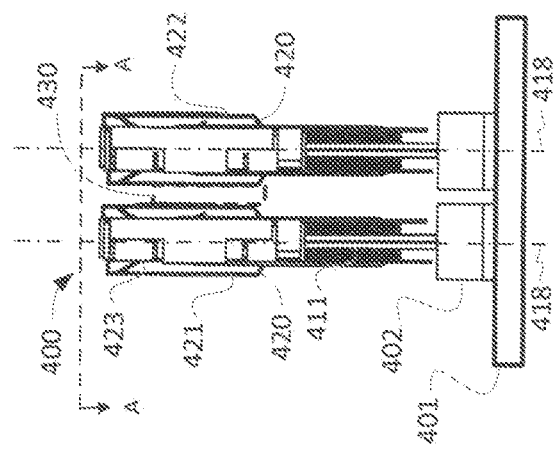
FIG. 4A is a perspective assembly view of a jacketed PCA including a single-layer thermal-transfer jacket that meets the thickness constraints determined in FIG. 3.
Figure 4B:
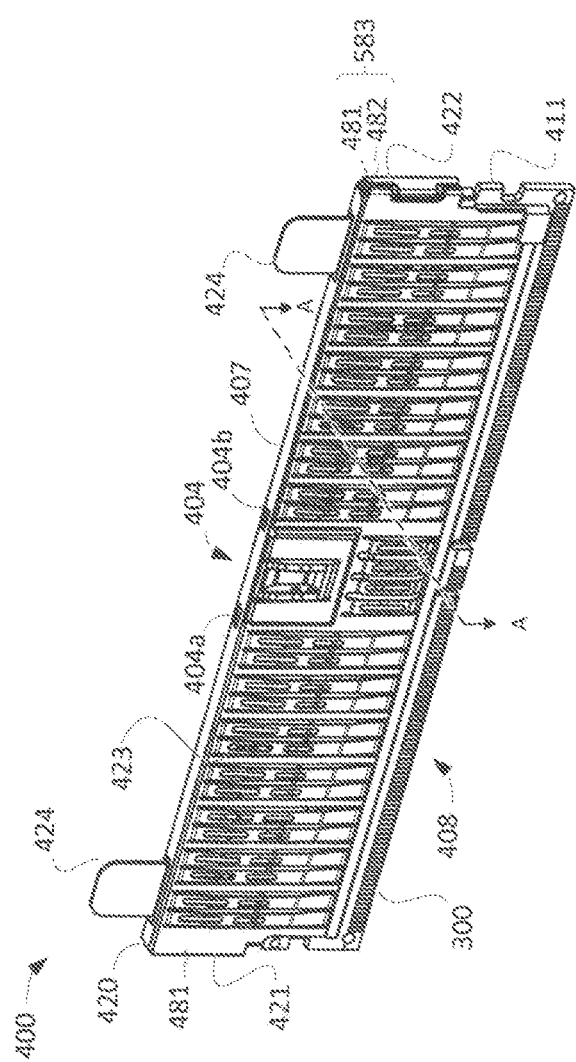
FIG. 4B is an end view of a pair of PCAs in thermal transfer jackets as in FIG. 4A installed in neighboring electronic sockets of a host board.
Figure 4E:
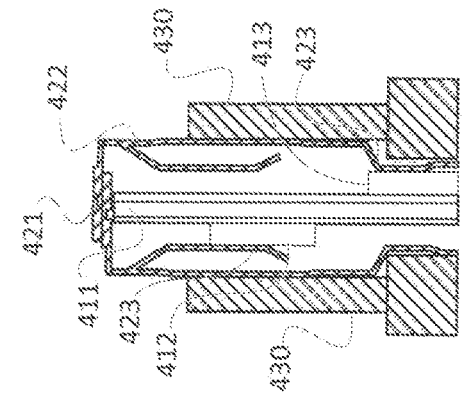
FIG. 4E is an end view of a third possible implementation of thermal devices that would be taken, as an example, relative to a cross-section such as line A-A in FIG. 4A of a high-powered PCA with tall components for transferring heat to a heat spreader with non-uniform thickness.
Figure 4D:
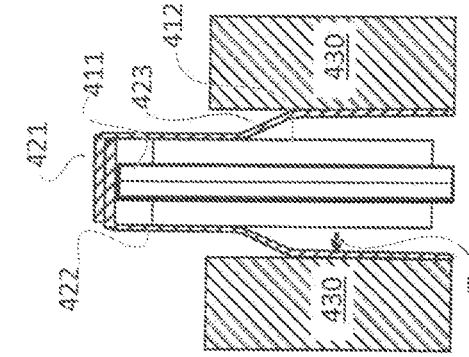
FIG. 4D is an end view of a second possible implementation of thermal devices that would be taken, as an example, relative to a cross-section such as line A-A in FIG. 4A of a higher-power jacketed PCA for transferring heat to external thermal transfer devices.
Figure 4C:
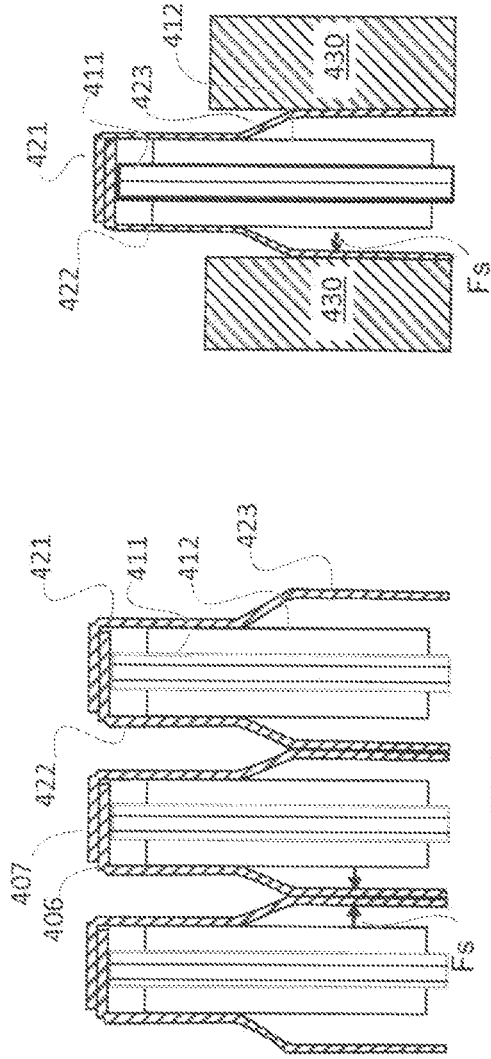
FIG. 4C is an end view of a possible implementation of thermal devices that would be taken, as an example, relative to a cross-section such as line A-A in FIG. 4A of several very closely spaced jacketed PCAs that will dissipate heat through the thermal transfer jackets of neighboring jacketed PCAs.

FIGS. 4A-4E show in greater detail various aspects of one example of a jacketed PCA 400 and how a living spring 423 may be modified to accommodate varying design constraints. Referring now to FIG. 4A, note that the edge connectors 300 discussed above relative to FIG. 3 and defining a printed circuit assembly interface 408 are shown in FIG. 4A. The thermal transfer jacket 420 includes a snap closure 404 that secures a mechanical engagement of a first cover 421 and a second cover 422 about a PCA that is obscured by the thermal transfer jacket 420 in FIG. 4A. The snap closure 404 comprises a pair of tabs 404*a* formed on the lip 406 (shown in FIG. 4C) of the first cover 421 that snap into a pair of slots 404*b* in lip 407 of the second cover 422 as the first cover 421 and the second cover 422 are joined together. This leaves the lip 407 overlapping lip 406 as shown in FIG. 4C.

Still referring to FIG. 4A, the jacketed PCA 400 also includes an optional plurality of pull tabs 424 affixed to the lip 407 of the second cover 422. The pull tabs 424 may be used to disassemble the jacketed PCA 400 from the from the first printed circuit board 401 and the cooling frame once inserted into the electronic sockets 402 in the manner shown in FIG. 4B. The pull tabs 424 may be fabricated of a flexible material so that they may be bent over. For example, they may be bent as a compute system is disposed in a tray (not shown) and inserted into a rack (also not shown) or other enclosure. Some examples, such as the example of FIG. 1, may omit the pull tabs 424.

Also as is best shown in FIG. 4A, the jacketed PCA 400 includes a plurality of living springs 423. In some examples not shown, only a single one of the first cover 421 and the second cover 422 includes a plurality of living springs 423. However, in the examples shown here, each the first cover 421 and the second cover 422 includes a plurality of living springs 423. This can be seen in FIGS. 4B-4E, where each living spring 423 is integral to the first cover 421 or the second cover 422 in the sense they are formed of a single piece therewith. Each of the first cover 421 and the second cover 422 is fabricated from a single layer of material having a thermal conductivity of at least 350 W/m/K and a thickness of at most 0.25 mm. However, other examples may use materials having different thermal conductivities, and materials having different thicknesses.

Returning to FIG. 4B, a pair of jacketed PCAs 411 (only one indicated) in thermal transfer jackets 420 (only one indicated) as in FIG. 4A are illustrated in a first deployment. More particularly, the jacketed PCAs 400 are installed in neighboring electronic sockets 402 of a first printed circuit board 401. The first printed circuit board 402 may be referred to as a "host board" in the sense that it "hosts" the jacketed PCAs 400. Note the use of the heat spreader 430 between the two jacketed PCAs 400. The jacketed PCAs 400 are oriented vertically relative to the force of gravity and the first printed circuit board 401 is oriented horizontally. This is their nominal orientation in operation, but other examples may use different orientations.

As the jacketed PCAs 400 are inserted into the electronic sockets 402, the living springs 423 are compressed inwardly relative to a centerline 418 of each jacketed PCA 400 by surrounding components. In the example of FIG. 4B, the compression of the living springs 423 is caused by the mechanical engagement of the thermal transfer jackets 420 with the thermal transfer device 430 and the distance between the two jacketed PCAs 400. Note that such compression may be caused similarly by mechanical engagement with a neighboring jacketed PCA 400, a thermal transfer device, or the cooling frame and associated distances in examples without the thermal transfer devices 430. Examples of such are shown in FIGS. 13A-13C and discussed further below.

The living springs 423 are, more technically, elastically displaced from their resting position as the jacketed PCAs 400 are inserted. As used herein, a living spring is capable of being "elastically displaced" if it elastically deforms in response to its contact surface being displaced up to (a) 2 mm inwards, or (b) to the point that it is flush with a planar portion the part the living spring extends from. The living spring "elastically deforms" if the deformations resulting from the displacement are not permanent and the living spring substantially returns to its original configuration when the force that caused the displacement is removed.

The compression described above permits the jacketed PCA 400 to "squeeze" into the available space defined by the cooling frame 140 (shown in FIG. 1), the thermal transfer devices 430, and the other jacketed PCAs 400 as discussed relative to FIG. 3 above. Once the jacketed PCA 400 is installed as shown in FIG. 4B, the compressed living springs 423 exert a compressive force Fs of at least about 45 N as represented by the arrows in FIG. 4C and FIG. 4D. The term "about" as used herein is an acknowledgement that precision as to the value may be difficult to achieve because of tolerances and errors in manufacturing, changes in materials properties over time, and other similar considerations.

The compression of the living springs 423 as the jacketed PCA 400 is inserted into the electronic sockets 402 and the clearances described above relative to FIG. 3 help establish much of the aforementioned thermal coupling. For instance, the compression ensures the physical engagement—and, hence, thermal coupling-between the electronic components 412, 413 and the thermal transfer jacket 420. The clearances described above ensure that the living spring 423 is compressed and that the thermal transfer jacket 420 physically engages the neighboring cooling frame 140 (shown in FIG. 1), thermal transfer device 430, and/or jacketed PCA 400 as the case may be. Again, this physical engagement also establishes a thermal coupling amongst all these parts of the thermal transfer assembly and the compute system at large.

The design of the living spring 423 may be modified to accommodate different designs for the deployment and arrangement of the jacketed PCAs 400. FIG. 4C is an end view of a possible implementation of thermal devices that would be taken, as an example, relative to a cross-section such as line A-A in FIG. 4A of several very closely spaced jacketed PCAs 400 that will dissipate heat through the thermal transfer jackets of neighboring jacketed PCAs. FIG. 4D is an end view of a second possible implementation of thermal devices that would be taken, as an example, relative to a cross-section such as line A-A in FIG. 4A of a higher-power jacketed PCA 400 for transferring heat to external thermal transfer devices. FIG. 4E is an end view of a third possible implementation of thermal devices that would be taken, as an example, relative to a cross-section such as line A-A in FIG. 4A of a high-powered jacketed PCA 400 with tall components for transferring heat to a heat spreader with non-uniform thickness.

Figure 5A:
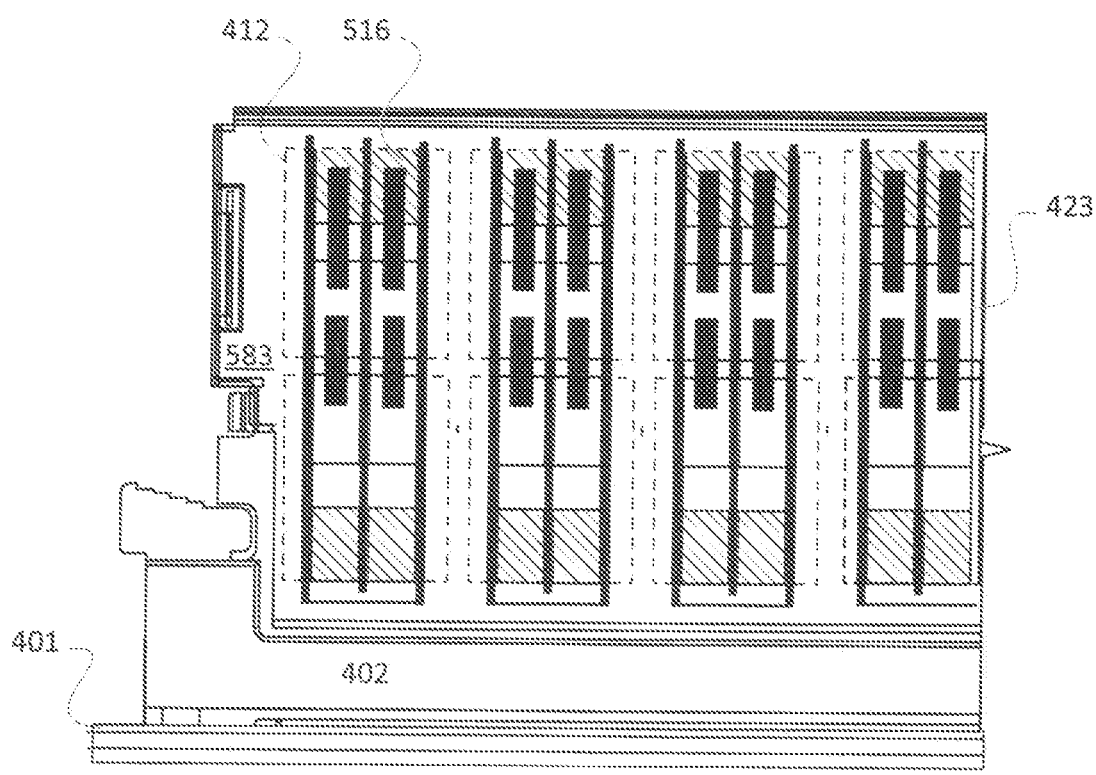
FIG. 5A is a side map view of areas of thermal contact between the thermal transfer jacket of FIG. 4A and the underlying PCA components.
Figure 5B:
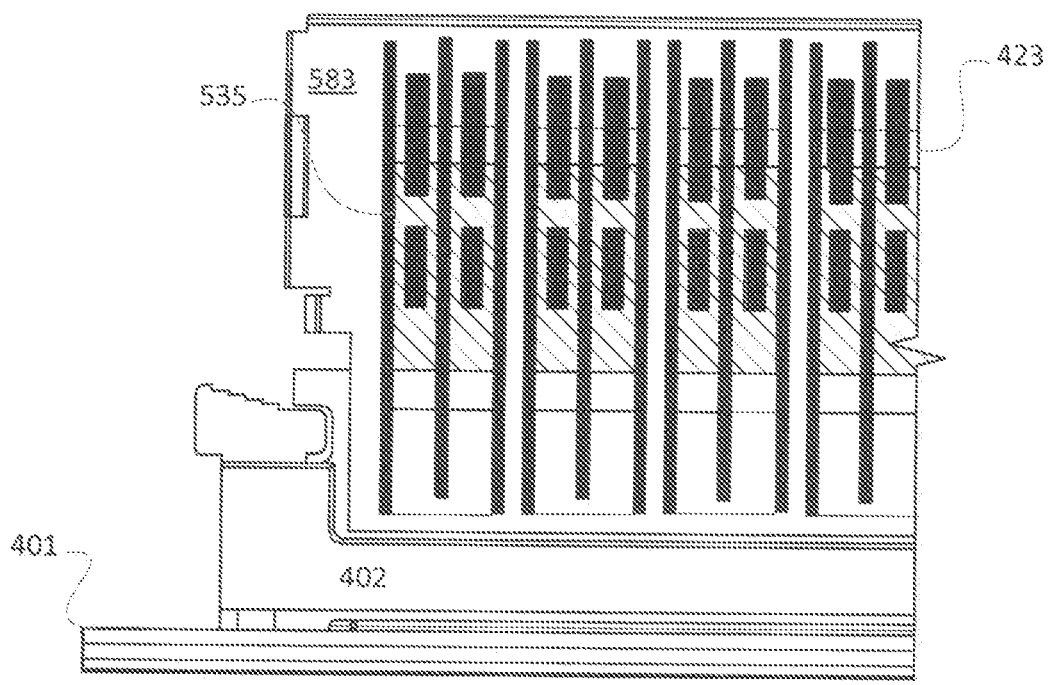
FIG. 5B is a side map view of areas of thermal contact between the thermal transfer jacket of FIG. 4A and the external heat spreader or neighboring jacket.

FIG. 5A is a side map view of areas of thermal contact 516 between the thermal transfer jacket 420 of FIG. 4A and the underlying electronic components 412, 413 if the PCA 410. The electronic components 412, 413 are shown in ghosted lines and the areas of thermal contact are indicated by hatching. FIG. 5B is a side map view of areas of thermal contact 535 between the thermal transfer jacket of FIG. 4A and the external heat spreader (not shown) or neighboring thermal transfer jacket (also not shown in FIG. 5B). Again, the areas of thermal contact are indicated by hatching.

Returning to FIG. 4A, the first cover 421 defines a first pair of tabs 481 and the second cover 422 defines a second pair of tabs 482 (only one shown). When the first cover 421 and the second cover 422 are closed and snapped together, the two pairs of tabs define a pair of tabs 583, one of which is shown in FIGS. 5A-5B. As the jacketed PCA 400 is inserted into the electronic socket 402, the tabs 583 slide into a cooling frame slot of the cooling frame as will be discussed below relative to FIG. 13C. Note that one of the tabs 482 fits over one of the tabs 481 in this example. This relationship is a part of the snap fit described above wherein the first cover 421 and the second cover 422 are snap fit together to form the thermal transfer jacket 420. However, this may be omitted in some examples.

Figure 6A:
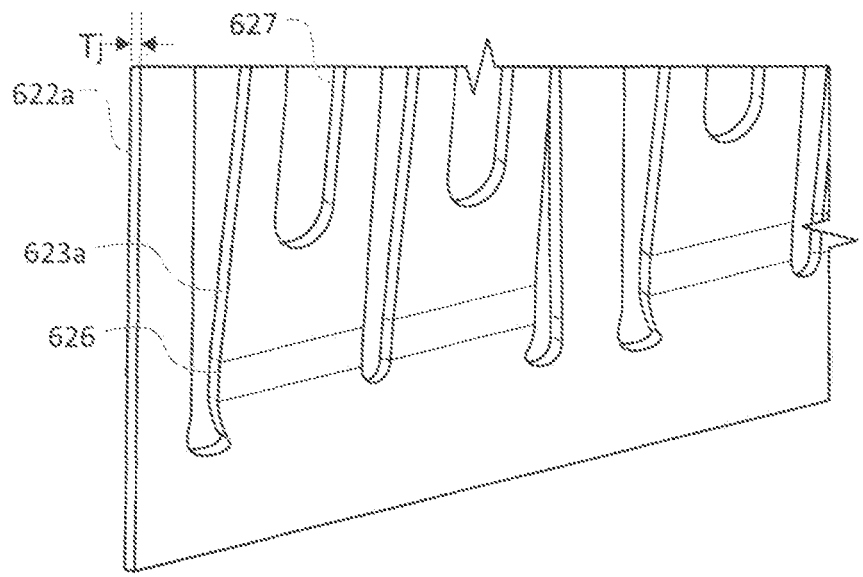
FIG. 6A is a perspective, magnified view of part of a bottom edge of a cover section of a thermal-transfer jacket, as shown in FIG. 1, formed with living springs that are illustrated as captive at both ends.
Figure 6B:
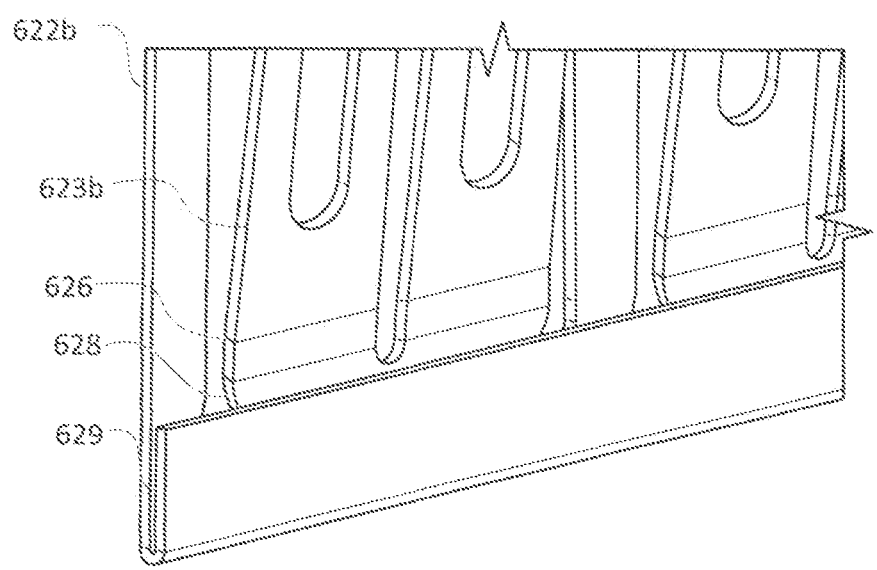
FIG. 6B is a perspective, magnified view of part of a bottom edge of a cover section of a thermal-transfer jacket, as shown in FIG. 1, formed with living springs that are illustrated as initially free at the bottom end, then secured by tucking into a hem fold.

Turning now to the living springs 123, FIG. 6A and FIG. 6B, selected details of the construction of the living springs 123, first depicted in FIG. 1, are shown. FIG. 6A is a perspective, magnified view of part of a bottom edge 600 of a first cover 121 of the thermal-transfer jacket 135, first shown in FIG. 1, formed with living springs 123 captive at both ends. The living spring 135 is created by removing material from the first cover 121 on each side of what will become the living spring 123. A flexure 626 is then created as is an opening 627. FIG. 6B is a perspective, magnified view of part of a bottom edge of a cover section of a thermal-transfer jacket, as shown in FIG. 1, formed with living springs 123 initially free at the bottom end 600, then secured by tucking into an optional hem fold 629.

As mentioned above, the living springs 123 in the illustrated example exert a spring force $F_s$ of at least 45 N. FIG. 6A-6B illustrate two implementations of the live springs 123 first shown in FIG. 1. A living spring 623a in FIG. 6A formed in a second cover 622a includes a flexure 626 at the bottom thereof and defines an opening 627 therein. The second cover 622a has a thickness $T_j$ of at most 0.25 mm. In FIG. 6B, a living spring 623b in a second cover 622b also includes a flexure 626. However, the living spring 623b also includes a lower tab 628 extending from the flexure 626 that is tucked into a hem fold 629 during manufacture.

The amount of spring force exerted can be controlled by managing implementation specific details of any given example. For instance, referring to FIGS. 6A-6B collectively, details such as material selection, the thickness T; of the material, the length of the living springs 623, the overall length and width of the opening 627, the length and width of the opening 627 relative to the length and width of the living spring 623 can affect the strength of the spring force $F_s$. In some examples, different living springs 623 may exert differing spring forces $F_s$. For instance, various living springs may be differently dimensioned or define openings with different dimensions to tailor the exerted spring force $F_s$. Other examples may include living springs that all exert approximately the same spring force $F_s$.

Various examples of the claimed subject matter may therefore employ living springs 123 exerting varying spring forces $F_s$ and are not limited to a spring force $F_s$ of at least about 45 N. Some examples may therefore implement living springs 123 exerting a spring force $F_s$ somewhere in the range of about 55 N to about 65 N. Still other examples may implement living springs 123 exerting a spring force $F_s$ somewhere in the broader range of about 45 N to 75 N.

Furthermore, the living springs 123 disclosed herein are, by way of example and illustration, but one means for thermally coupling the electronic components of a PCA to an external thermal transfer structure. Such external thermal transfer structures may include, for instance, the cooling frame 140, the thermal transfer device 130, and other jacketed PCAs 105 as is disclosed herein. Other examples not shown may employ structures equivalent to the living springs 123 that perform the stated function.

Figure 7:
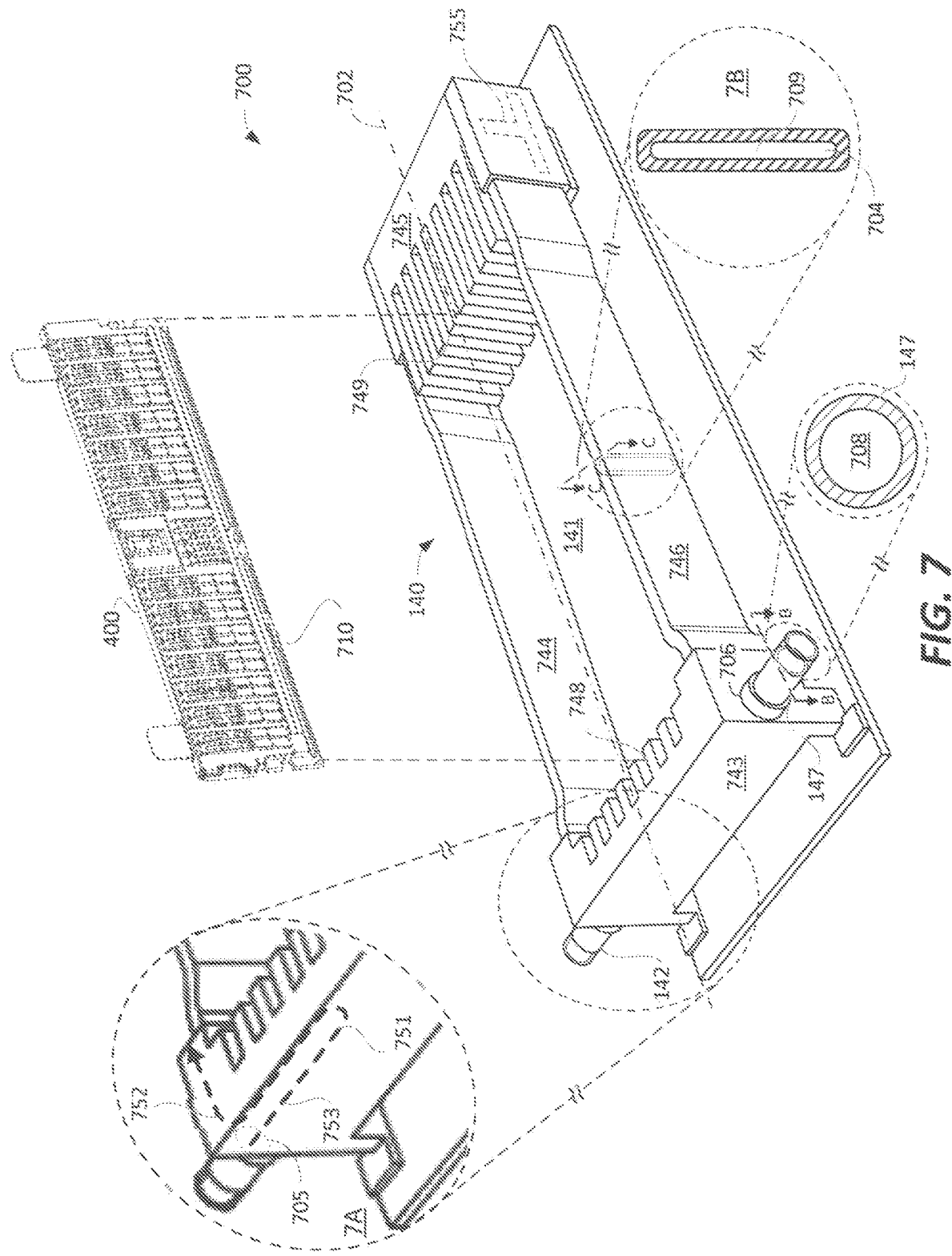
FIG. 7 is a perspective, magnified view of a cooling frame shown in FIG. 1 with details of the conduit shape change and bends that enhance turbulence and increase cooling efficiency.

Turning now to the details of the cooling frame 140, first shown in FIG. 1, FIG. 7 is a perspective, magnified view of a cooling frame 140 in the context of a thermal transfer assembly 700. FIG. 7 illustrates details of the intentionally designed turbulence enhancing artifacts including shape change and bends that enhance turbulence and increase cooling efficiency. The cooling frame 140 includes a first end block 743 and a second end block 745 joined by a first siderail 744 and a second siderail 746. As mentioned above, the cooling frame 140 may be fabricated as a single piece or may be fabricated in pieces and then assembled.

Also as discussed above, the directionality of the coolant flow through the coolant channel is not material to the functionality of the thermal transfer assembly 700. For the sake of convenience, some parts of the cooling frame 140 will be referred to as the "inlet" or "inlet side" or similarly and other parts as the "outlet" or "outlet side" or similarly. However, the illustrated example manifests a bilateral symmetry about the line 702 so that this inlet/outlet functionality may be reversed. It is therefore to be understood that this is a convenience only and that the labeling may be reversed in other examples—even those with the same structure. On the other hand, not all examples will necessarily manifest such bilateral symmetry as the examples illustrated.

The first end block 743, first siderail 744, second end block 745, and second siderail 746 cooperate to define the coolant channel. Three portions of the coolant channel are shown in FIG. 7. An inbound end block conduit 753 defined by the first end block 743 is shown in the breakout 7A and an outbound siderail conduit 704 is shown in the breakout 7B. The first end bock 743 also defines an outbound end block conduit (not shown) similar in shape to the inbound end block conduit 753. The second siderail 746 defines a similar inbound siderail conduit (not shown) and the second end block 745 may define a similar, second end block conduit (also not shown), although they may differ in other examples. In the illustrated example, the inbound siderail conduit has the same design and characteristics as the outbound siderail conduit 704. However, the second end block conduit not shown is a straight run from the inbound side rail conduit to the outbound siderail conduit 704. A portion of the second end block conduit 755 is shown in ghosted lines.

Turbulence occurs in the coolant flow in cold plates and similar structures and, conventionally, attempts are made to design channels and conduits through which a coolant may flow to minimize and/or mitigate the amount turbulence. It has been discovered, however, that turbulence in the coolant flow can improve heat transfer even well hampering the flow. Accordingly, the examples of the presently claimed subject matter turbulence enhancing artifacts that promote or enhance turbulence in the fluid flow. The illustrated examples include two different kinds of turbulence enhancing artifacts—namely, conduit shape change and bends.

More particularly, in the illustrated example, the inlet 705 and the outlet 706, like the first fitting 142 and the second fitting 147, have a circular cross-section such as the cross-section 708 taken through the second fitting 147 along line A-A. The second end block conduit, although not shown, also has a circular cross-section such as the cross-section 708. The inbound siderail conduit (not shown) and the outbound siderail conduit 704 have oval cross-sections such as the cross-section 709. Accordingly, the coolant flow transitions from the circular inbound end block conduit 753, into the oval inbound siderail conduit, into the circular second end block conduit, into the oval outbound siderail conduit 704, and into the circular outbound end block conduit 757. Each transition from a circular cross-section to an oval cross-section and back intentionally introduces turbulence into the coolant flow.

Figure 8A:
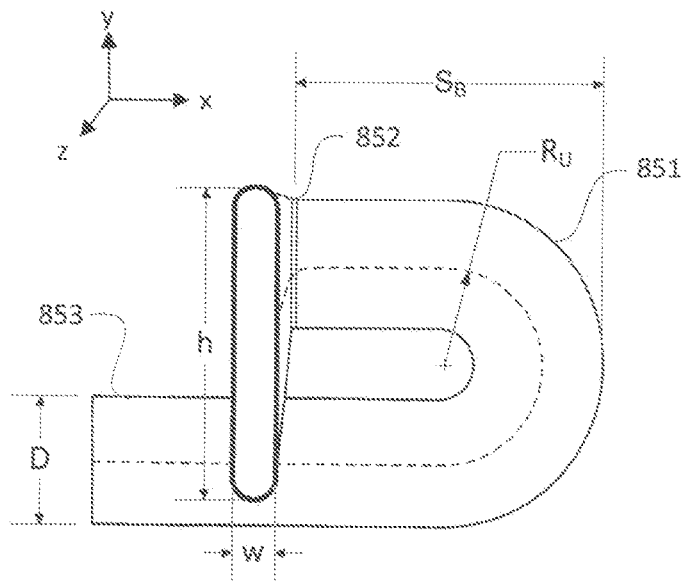
FIGS. 8A-8D illustrate selected characteristics of bends and cross-sections of the coolant channel.

The illustrated examples also use a number of turbulence enhancing artifacts including bends in the coolant conduit to enhance turbulence. This discussion of bends and the associated turbulence they enhance in the illustrated examples will focus on the U-bend 751 and the L-bend 752 first shown in FIG. 7 and shown in isolation with better detail in FIGS. 8A-8B. However, the principles may also be extrapolated to other bends in other locations of the coolant channel. When a liquid conduit is bent, the resulting introduction of turbulence partially depends on the ratio of the bend radius to the conduit diameter. At the same input flow rate, tighter bends cause more turbulence. If the circular inlet has diameter D, the U-bend radius $R_u$ for the U-bend 751, shown in FIG. 8A, is less than 1.5D and the L-bend radius $R_l$ for the L-bend 752, shown in FIG. 8C, is less than 1.2D. These are relatively tight bends and so enhance turbulence.

Figure 8B:
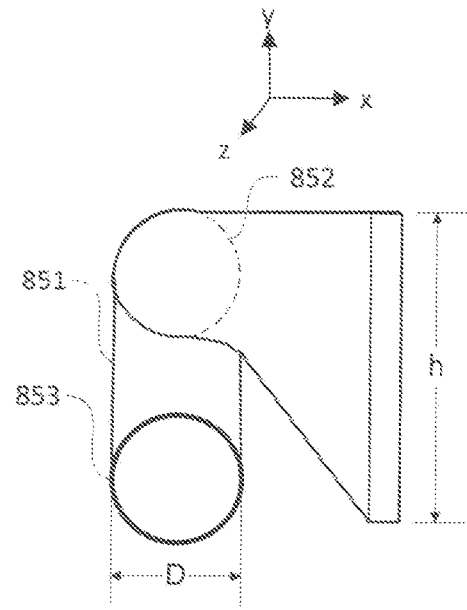
Figure 8C:
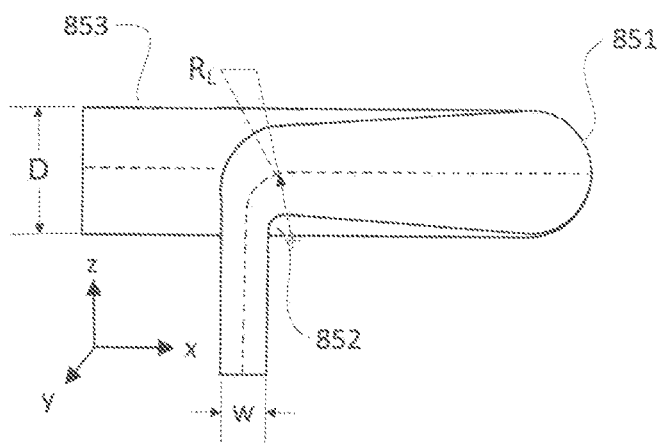

In the end block inbound conduit 853, the U-bend 851 is in a first plane and the L-bend is in a second plane orthogonal to the first plane as seen in FIG. 8A-FIG. 8C. The turbulence resulting from consecutive orthogonal bends is more uniformly distributed across the conduit than it would be if the U-bend 851 and the L-bend 852 were in the same plane. The distribution of the convection across the conduit in two orthogonal directions may be responsible for the notable increase in cooling efficiency. Once the coolant is past a bend, however, the turbulence decreases with distance from the last bend. Therefore, if the turbulence patterns from the two bends are to interact additively, the bends should be close together. In one modeled example, the distance Se, shown in FIG. 8A, between the two bends 852, 853 was roughly 2.5× the conduit diameter D. It is generally believed that it is more desirable for the two bends 852, 853 to be closer rather than further. In various embodiments, the distance $S_B$ between the two bends 852, 853 is about two to three times the diameter D.

Figure 8D:
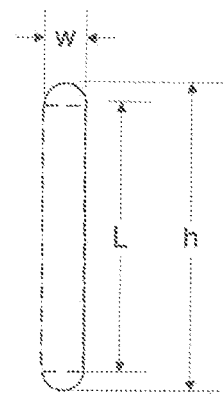

In one example, the first siderail 744 and second siderail 746 were fabricated by flattening 8 mm Copper tubing until the aspect ratio h/w, shown in FIG. 8D, was roughly three. The circular inlet 705, outlet 706, inbound end block conduit 753, and outbound end block conduit 757 each have a diameter D=8 mm. Therefore, although the shape of the conduit changes from circular to oblong, its cross-sectional area remains about the same:

$$\pi\left(\frac{D}{2}\right)^2 = Lw + \pi\left(\frac{w}{2}\right)^2$$

where L=h−w as shown in FIG. 8D. Preserving the cross-sectional area throughout the shape change may mitigate against undesirable drops in liquid pressure and velocity that can result from bend-enhanced turbulence.

Figure 9A:
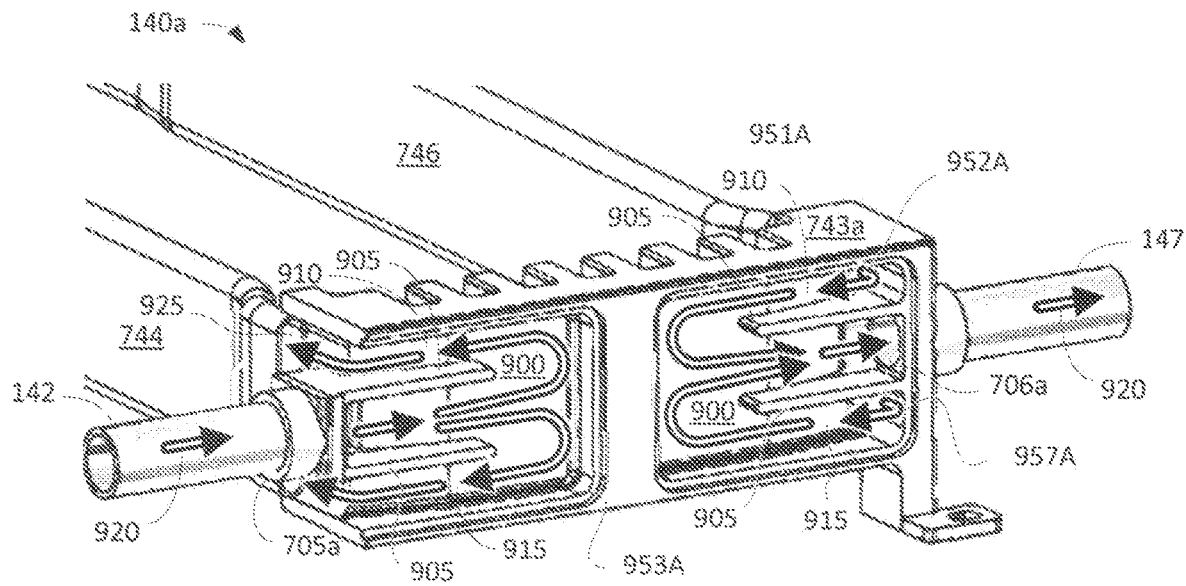
FIG. 9A is a perspective cutaway view of an example of a turbulence-enhancing end block conduit in the cooling frame of FIG. 7.
Figure 9B:
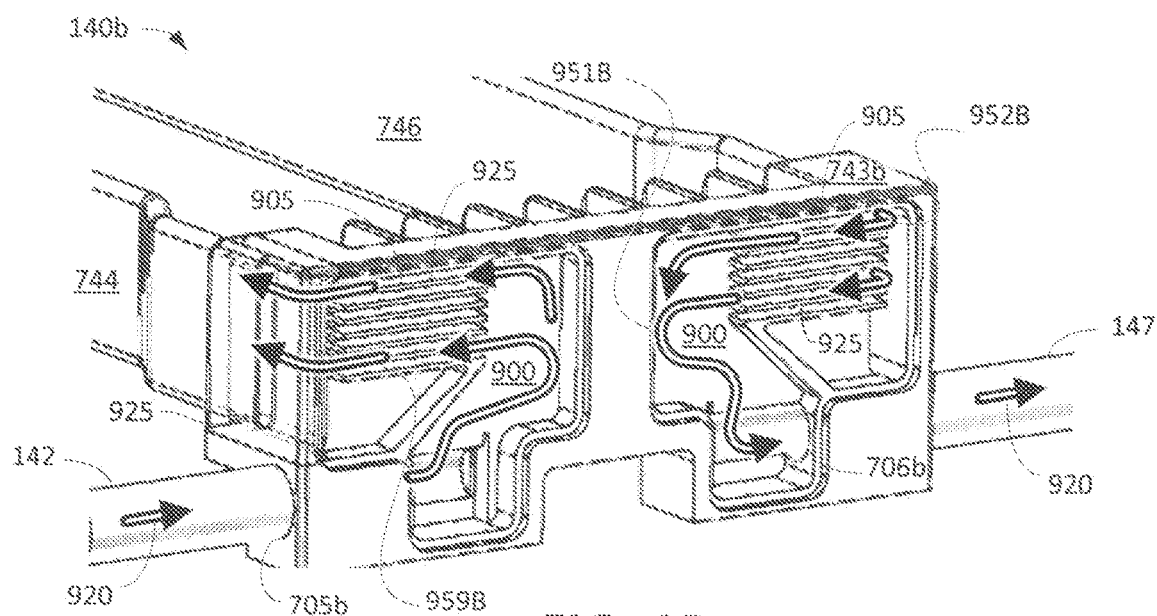
FIG. 9B is a perspective cutaway view of another example of a turbulence-enhancing end block conduit in the cooling frame of FIG. 7.

FIG. 9A-FIG. 9B illustrate in more detail two different implementations of the first end block 743, the inbound end block conduit 753, and the outbound end block conduit 757 of FIG. 7. In each of FIG. 9A and FIG. 9B, the coolant 920 engages in several bends in the chamber 900 that are not strictly defined by the walls of the conduit as discussed above relative to FIG. BA-FIG. BC. These bends also enhance turbulence in the flow of the coolant just as does the design of the coolant conduit shown in FIG. 8A-FIG. BC.

FIG. 9A is a perspective cutaway view of an example of turbulence-enhancing end block conduits in the cooling frame of FIG. 7. The first end block 743a defines on both the inbound and outbound sides a chamber 900 in which are disposed a pair of guides 905 bracketing the inlet 705a and, in turn, defining a top channel 910 and a bottom channel 915. The terms "top" and "bottom" are defined relative to the field of gravity when the cooling frame 140a is in its nominal orientation for use, which is shown in FIG. 9A-FIG. 9B.

The coolant, represented by the arrows 920 (only two indicated), enters the chamber 900 under pressure through the inlet 705a and flows as indicated by the arrows 920. More particularly, the flow of the coolant 920 is redirected by the back of the chamber 900 into the top channel 910 and the bottom channel 915 whereupon it flows into the inbound siderail conduit 925. After circulating through the first siderail 744, the second end block 745, and the second siderail 746, all of which are shown in FIG. 7, the coolant 920 returns to the first end block 743a. The coolant 920 then enters the outbound chamber 900 through the top channel 910 and the bottom channel 915 whereupon it is redirected into the outlet 708a.

FIG. 9B is a perspective cutaway view of another example of a turbulence-enhancing end block conduit in the cooling frame of FIG. 7. In this example, the inlet 705b is located relatively lower down on the first end block 743b as compared to the inlet 705a in FIG. 9A. Again, the first end block 743b defines a chamber 900 on both the inbound and outbound sides of the end block 743b. A plurality of guides 905 are disposed in the chamber 900 to define a plurality of channels 925. The guides 905, which are greater in number than in FIG. 9A, do not bracket the inlet 705b in this example.

The coolant 920 enters the inbound chamber 900 under pressure through the inlet 705b and is redirected and flows as indicated by the arrows 920. The coolant 920 is redirected by the back of the chamber 900 into the channels 915 defined by the guides 905 whereupon it flows into the inbound side rail conduit 925. After circulating through the first siderail 744, the second end block 745, and the second siderail 746, all of which are shown in FIG. 7, the coolant 920 returns to the first end block 743b. The coolant 920 then enters the outbound chamber 900 through the channels 930 (only one indicated) whereupon it is redirected into the outlet 708b.

Returning now to FIG. 7, both the first end block 743 and the second end block 745 define a plurality of cooling frame slots 748, 749, respectively. The cooling frame slots 748, 749 and the electronic sockets 402 (shown in FIG. 4B) define the PCA slots such as the PCA slots 120 in FIG. 1. The jacketed PCA(s) 400 are inserted into the electronic sockets 402, shown in FIG. 4B, disposed in the framed interior space 741 as discussed above but not shown in FIG. 7. This insertion includes inserting the tabs 583, shown in FIG. 5A-FIG. 5B, into the cooling frame slots 748, 749 of the cooling frame 740. A mechanical engagement and thermal coupling between the jacketed PCA 400 and the cooling frame 740 is thereby established at that point of insertion into the cooling frame slots 748, 749. Where thermal transfer devices such as the thermal transfer devices 430 in FIG. 4C-FIG. 4E, they may be inserted into separate cooling frame slots between the jacketed PCAs 400 and structure of the respective end blocks 743, 745 as will be discussed relative to FIG. 13C.

Figure 10A:
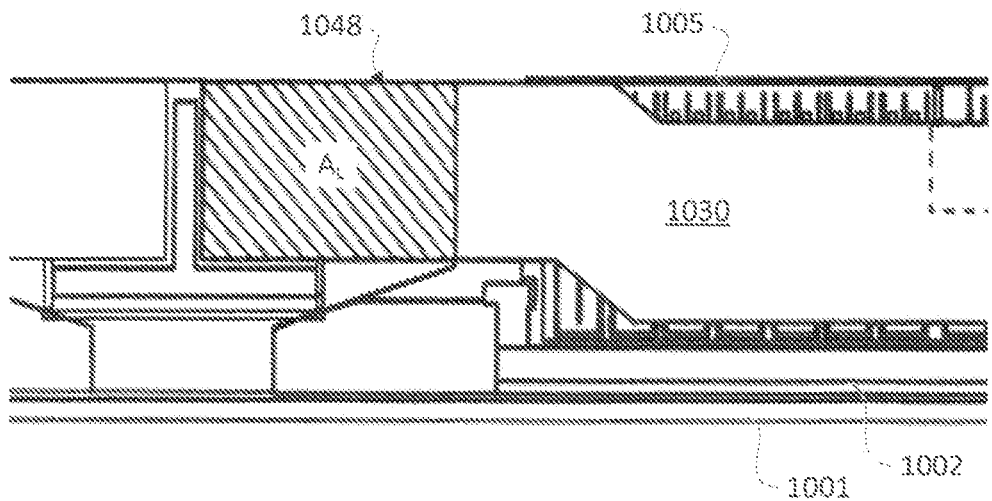
FIG. 10A is a cutaway side view of a contact area between a jacket or heat spreader and a cooling-frame slot when the conduit makes an L-bend but no U-bend or shape change.
Figure 10B:
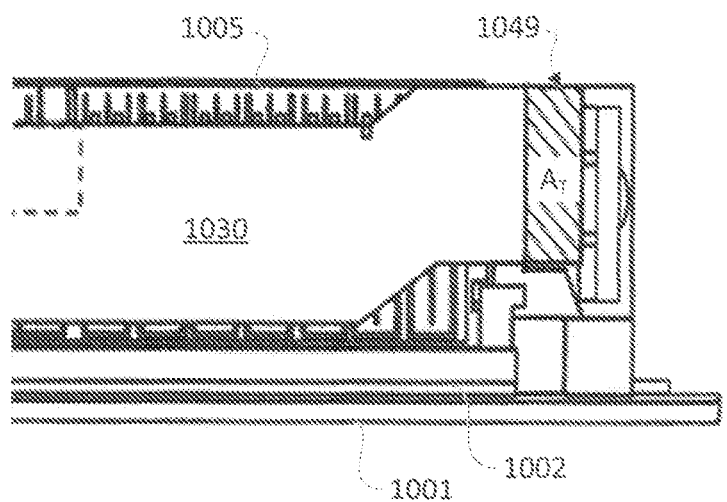
FIG. 10B is a cutaway side view of a contact area between a jacket or heat spreader and a cooling-frame slot when the conduit makes an L-bend, U-bend, and shape change.

The turbulence enhancing artifacts cause increased turbulence that, in turn, increases the efficiency of the thermal transfer into the coolant and thereby reduces the area of thermal contact relative to laminar flow in order to achieve the same thermal transfer. FIG. 10A and FIG. 10B each show a jacketed PCA 1005 and thermal transfer device 1030 inserted into an electronic socket 1002 mounted to a first printed circuit board 1001 and a cooling frame socket 1048. FIG. 10A is a cutaway side view of a thermal contact area $A_L$ between a jacket or a thermal transfer device 1030 and a cooling-frame slot 1048 when the conduit makes an L-bend but no U-bend or shape change. FIG. 10B is a cutaway side view of a thermal contact area $A_T$ between a jacket or thermal transfer device 1030 and a cooling-frame slot 1048 when the conduit makes an L-bend, U-bend, and shape change. Note the difference in thermal contact area between the two.

Figure 11:
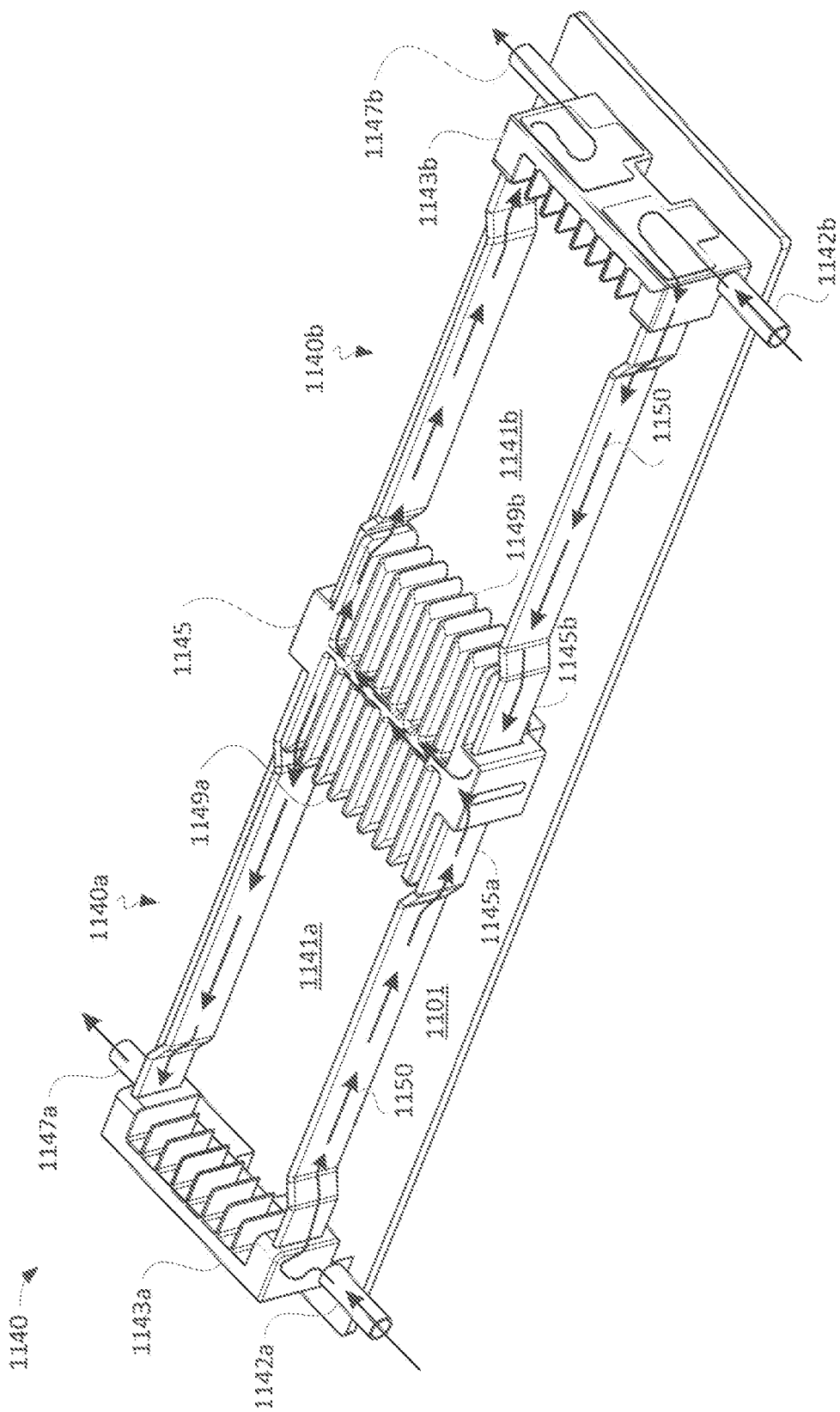
FIG. 11 is a perspective view (with a flow-map overlay) of a double version of the cooling frame of FIG. 7 capable of cooling two banks of closely spaced PCAs.

FIG. 11 illustrates another example in which two cooling frames and thermal transfer assemblies are formed back-to-back. More particularly, FIG. 11 is a perspective view (with a flow-map overlay) of a double version of the cooling frame 740 of FIG. 7 capable of cooling two banks of closely spaced PCAs. The cooling frame 1140 includes to first end blocks 1143a, 1143b and a midblock 1145. The midblock 1145 may generally be thought of as two conjoined second end blocks 1145a, 1145b. Note the single midblock conduit 1107 portion of the coolant flow path 1150 in which coolant whose flow is represented by the arrows 1107 from both sides 1140a, 1140b flows. Each of the first end blocks 1143a, 1143b receives coolant through respective first fittings 1142a, 1142b and discharges coolant through respective second fittings 1147a, 1147b.

The cooling frame 1140 is shown mounted to a first printed circuit board 1101. Each cooling frame side 1140a, 1140b defines a respective framed interior space 1141a, 1141b as discussed above relative to the cooling frame 140 of FIG. 1. Although not shown for the sake of clarity, a plurality of electronic sockets, such as the electronic sockets 402 shown in FIG. 4B, are mounted to the first printed circuit board 1101 inside the framed interior spaces 1141a, 1141b.

Each of the endblocks 1143a, 1143b also defines a respective plurality of cooling frame slots 1149a, 1149b as does the midblock 1145, also as discussed above relative to the cooling frame 740 in FIG. 7. Jacketed PCAs such as the jacketed PCA 400 shown in FIG. 4 may then be inserted into the cooling frame sockets 1149a, 1149b and electronic sockets (not shown) where, in operation, they are cooled as described above. Note that neither the endblocks 1143a, 1143b nor the midblock 1145 define slots for insertion of thermal transfer devices. Thus, the example of FIG. 11 does not employ thermal transfer devices.

Figure 12:
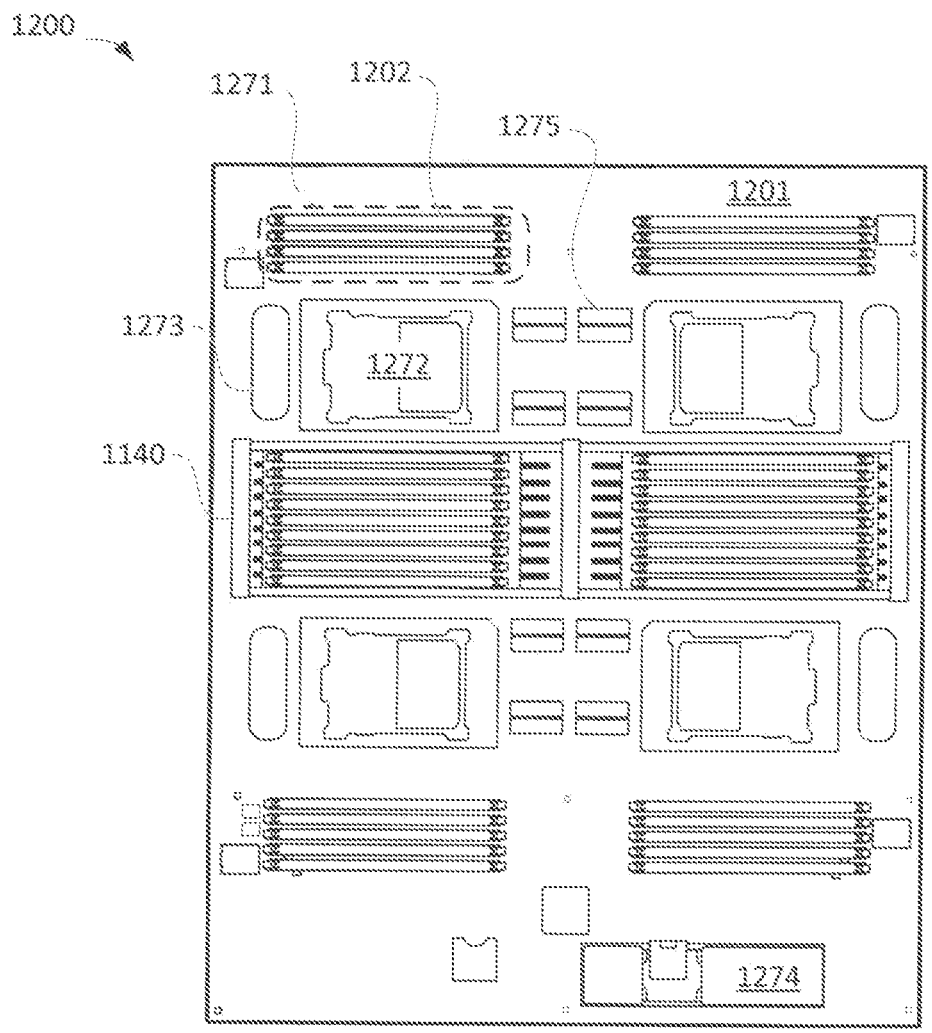
FIG. 12 is a top view of a host board for a computing system with banks of PCA sockets compatible with the double cooling frame of FIG. 11.

FIG. 12 is a top view of a host board 1200 for a computing system with banks of PCA sockets compatible with the double cooling frame of FIG. 11. More particularly, in addition to the cooling frame 1140, the first printed circuit board 1201 serving as a host board includes several arrays of PCA socket arrays 1271 (only one indicated). Note the socket arrays 1271 disposed within the interior framed spaces of the cooling frame 1100. Additionally, the first printed circuit board includes a processor socket 1272, a voltage regulator socket 1273, a storage socket 1274, and an expansion socket 1275. Note that many of these features are implementation specific and that other examples might include other structures in addition to, or in lieu of, those shown.

FIG. 13A-FIG. 13C depict several examples of having differing numbers of jacketed PCAs and thermal transfer devices. Each of the cooling frames 1340a, 1340b, 1340c defines a respective coolant channel 1350a, 1350b, 1350c shown in ghosted lines. The second end block conduits 1370a, 1370b, 1370c are also shown. The portions of the coolant channels 1350a, 1350b, 1350c defined by the respective first end blocks 1343a, 1343b, 1343c may include chambers, guides, and channels such as were discussed relative to FIG. 9A-9B although such are not shown. Note also the jogs 1355 in the side rails of the cooling frames 1340a, 1340b, 1340c that also enhance turbulence in the coolant flow.

FIG. 13A is a top assembly view of a cooling frame 1340a and thermal transfer jacket 1320 for a single high-powered PCA 1310a. The first end block 1343a defines a first cooling frame slot 1348a and the second end block 1345a defines a second cooling frame slot 1349a into which the PCA 1310a and the thermal transfer jacket 1320 are inserted. This example is particularly useful where a PCA 1310a consumes a lot of power, and therefore generates a relatively greater amount of power warranting a dedicated thermal transfer assembly. Note the absence of a thermal transfer device given the direct thermal coupling of the jacketed PCA 1310a.

FIG. 13B is a top, assembly view of a cooling frame 1340b for a bank of moderately high-powered, closely spaced, jacketed PCAs 1305b with no thermal transfer devices. The first end block 1343b defines a plurality of first cooling frame slots 1348b (only one indicated) and the second end block 1345b defines a plurality of second cooling frame slots 1349b (only one indicated) into which the PCAs 1310b and the thermal transfer jackets 1320 are inserted. Again, note the absence of any thermal transfer devices.

FIG. 13C is a top, assembly view of a cooling frame 1340c and jacketed PCAs 1305c for a bank of lower-power, but very closely spaced, PCAs 1310c. The first end block 1343c defines a plurality of first cooling frame slots 1348c (only one indicated) and the second end block 1345c defines a plurality of second cooling frame slots 1349c (only one indicated). In this example, the PCAs 1310c are and the thermal transfer jackets 1320 are not inserted into the cooling frames slots 1348c, 1349c. The PCAs 1310c are only inserted into the sockets (not shown). Instead, the thermal transfer devices 1330 are inserted into the cooling frame slots 1348c, 1349c as shown.

Note also the presence the thermal transfer devices 1330 in the example of FIG. 13C. The insertion of the thermal transfer devices 1330 into the cooling frame slots 1353, 1354 (only one of each designated) establishes physical engagement and thermal coupling with the jacketed PCAs 1305c. The insertion also establishes physical engagement and thermal coupling between the thermal transfer devices 1330 and the cooling frame 1340c. Consequently, the insertion thermally couples the PCAs 1035c to the first end block 1343c and the second end block 1345c.

Those in the art having the benefit of this disclosure will appreciate still further variations in terms of the number jacketed PCAs, the number of heat transfer devices, and combinations thereof with which cooling frames as disclosed herein may be deployed. These numbers and configurations will be implementation specific depending on the amount of heat generated by the jacketed PCAs and the design constraints for mitigating or disposing of that heat. Accordingly, various examples of the subject matter claimed below are not limited to the number of jacketed PCAs and thermal transfer devices shown in the illustrated examples nor the configurations shown.

Various examples are amenable to variation in the design of the thermal transfer device where thermal transfer devices are used. Heat spreaders placed between jacketed PCAS may perform both thermal and mechanical functions. Thermally, they diffuse heat delivered through the thermal-transfer jackets from neighboring PCA components. Mechanically, they compress the living springs of the thermal-transfer jackets against the PCA components.

The socket spacing on the host board, combined with the PCA substrate thickness and the locations and heights of the PCA components, places an upper limit on heat-spreader thickness (see, e.g., the discussion of FIG. 3). This upper limit may vary with position over the length and width of the heat spreader. Meanwhile, the range of usable heat-spreader materials is constrained by the amount of heat to be dissipated in the limited thickness. Finally, the heat spreader must be sufficiently stiff to maintain compression of the living springs over a useful lifetime of years without deforming; this may impose a lower limit on thickness.

Figure 14A:
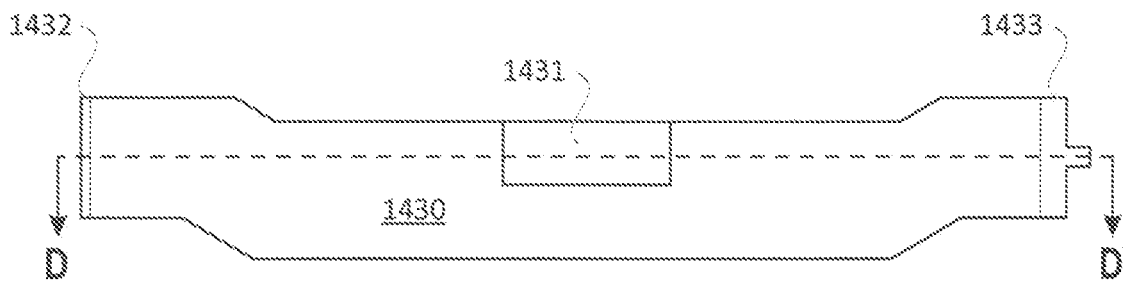
FIG. 14A is a side view of the thermal transfer device of FIG. 1.

FIG. 14A is a side view of the thermal transfer device 1430 of FIG. 1. The thermal transfer device 1430 is, in this example, a heat spreader. The thermal transfer device 1430 includes a cutout or relief 1431 to accommodate the contours of certain electronic components (not shown) of the jacketed PCA (also not shown) to which the thermal transfer device 1430 is to be physically engaged and thermally coupled. The thermal transfer device 1430 also includes an end taper 1432 and an end tab 1433 by which the thermal transfer device 1430 engages the cooling frame slots (not shown) of the cooling frame (also not shown).

Figure 14B:
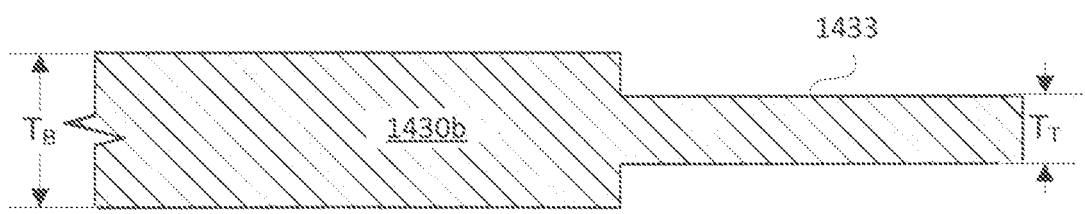
FIG. 14B is a section view (through section D-D of FIG. 14A) of one example of a thermal transfer device that is a solid heat spreader.

FIG. 14B is a section view through section D-D of FIG. 14A for one example of a thermal transfer device 1430b that is a solid heat spreader. More particularly, the thermal transfer device 1430 is a solid heat spreader and, still more particularly, a solid copper example of the heat spreader of FIG. 12A. Note that only a portion of the thermal transfer device 1430b is shown. The thermal transfer device 1430b has a solid body with a thickness of $T_T$ in the end tab 1433 and the end taper 1432 (not shown) and a thickness of $T_B$ in between.

The body thickness $T_B$ that dissipates sufficient heat and provides enough stiffness for reliable uniform spring-loading may be 2-5 mm, for example 3.5 mm. In some-examples, this may be too wide to fit between tall components on neighboring jacketed PCAs. If only a limited area on the PCA (e.g., less than 50% or less than 25%) is occupied by tall components, the tightest spaces may be accommodated by recesses (such as cutout or relief 1431 on FIG. 14A) or step-downs (such as end tab 1433) so that the overall heat dissipation and stiffness are minimally compromised.

For instance, tab thickness $T_T$ may be as thin as 0.1-0.2 mm, but it may account for only a small extent of the heat spreader's overall area. Additionally or alternatively, the recess or tab may be located close to the cooling-frame slot where its stiffness is reinforced by the slot walls and any heat buildup is convected away by the liquid flowing through the cooling block. However, if the desirable recesses or tabs account for too large a fraction of the heat spreader's area. or are in an inconvenient location for heat buildup, a material with higher conductivity (or a more complex structure such as a vapor chamber) may provide the desired heat dissipation and stiffness with a smaller body thickness $T_B$.

Figure 14C:
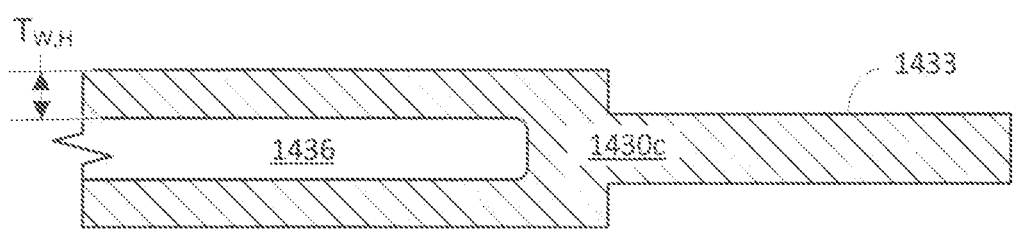
FIG. 14C is a section view (through section D-D of FIG. 14A) of one example of a thermal transfer device that is a hollow heat spreader.

FIG. 14C is a section view through section D-D of a hollow example of the heat spreader of FIG. 12A. In this example, the body of the thermal transfer device 1430c between the end tab 1433 and the end taper (not shown) defines an air pocket or space 1436. The air pocket 1435 is open to the ambient atmosphere through the bottom of the thermal transfer device 1430c.

Because the hollow interior 1436 is air, gas, or a vacuum rather than a highly thermally conductive material, it weighs less than the solid heat spreader of FIG. 14A. The hollow heat spreader may also cost less than its solid counterpart if the fabrication costs of the hollow example do not completely offset the savings on materials. The thickness $T_{W,H}$ of the walls surrounding hollow interior 1436 is preferably sufficient to provide the necessary stiffness and heat dissipation.

Figure 14D:
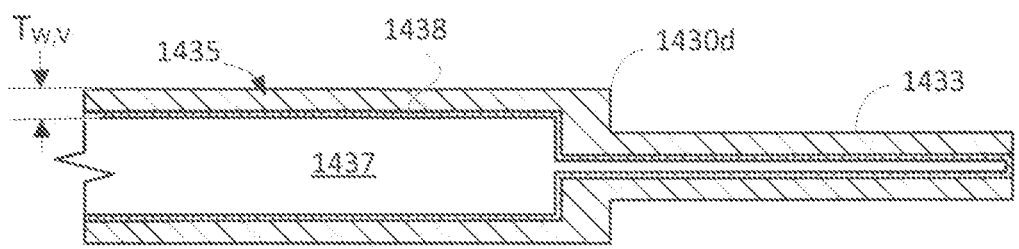
FIG. 14D is a section view (through section D-D of FIG. 14A) of one example of a thermal transfer device that is a vapor chamber heat spreader.

FIG. 14D is a section view (through section D-D of FIG. 14A) of one example of a thermal transfer device 1430d that is a vapor chamber heat spreader. In this example, the vaper chamber functions as a flattened heat pipe. More particularly, between the end taper (not shown) and the end tab 1433, the body of the thermal transfer device 1430d defines a vapor chamber including a vapor core 1437 and a wicking layer 1438. The vapor chamber is enclosed and isolated from the ambient atmosphere.

Vapor core 1437, which may optionally extend into thinned areas such as the tab, is filled with a thermal phase-change material. and lined with a very thin (<0.2 mm) wick layer 1438. The phase-change material becomes a gas at the "hot interface" (thermal contact area between the jacket and the heat spreader, area 535 on FIG. 5B). The gas expands and travels through core 1437 to the "cold interface" (thermal contact area between the cooling frame and the heat spreader, area $A_L$ on FIG. 10A or area $A_T$ on FIG. 10B). There it condenses back into a liquid and travels along wick layer 1438 back to the hot interface.

The effective thermal conductivity of a vapor chamber depends in part on its dimensions, but may equal or exceed 10 kW/m/K at sizes similar to the heat spreaders described herein. By contrast, the copper walls' thermal conductivity is 0.3-0.4 kW/m/K; therefore, the phase-change material in core 1437 does the bulk of the heat dissipation. The copper walls only need to provide sufficient stiffness for loading the living springs in the neighboring thermal-transfer jackets. The thickness $T_{W,V}$ of the copper walls surrounding vapor-chamber core 1437 may be 0.4-0.6 mm, for example 0.5 mm.

The three heat spreaders illustrated in FIGS. 14B-14D were compared in a thermal model of a temperature-control system for an array of closely packed PCAs. The system included a cooling frame and jacketed PCAs as well as the heat spreaders. For the modeled heat spreaders, the wall material was copper, the body thickness $T_B$ was 3.5 mm, and the tab thickness $T_T$ was 0.15 mm.

Those ordinarily skilled in the art having the benefit of this disclosure will appreciate that still other variations on the thermal transfer device of the claimed subject matter may be realized in addition to those illustrated herein. Furthermore, the choice among the variations will be implementation specific depending on the amount of heat generated by the jacketed PCAs and the design constraints for mitigating or disposing of that heat. Other as constrains such as performance, cost, manufacturability, etc. may also influence the choice.

Figure 15A:
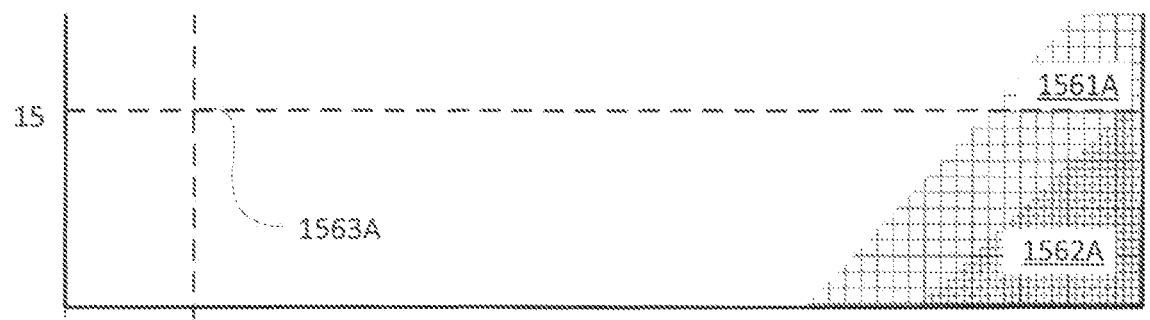
FIG. 15A-15C are data charts of thermal model results for the cooling system of FIG. 12B with the three alternative thermal transfer devices of FIGS. 14A-14C in one particular example.
Figure 15B:
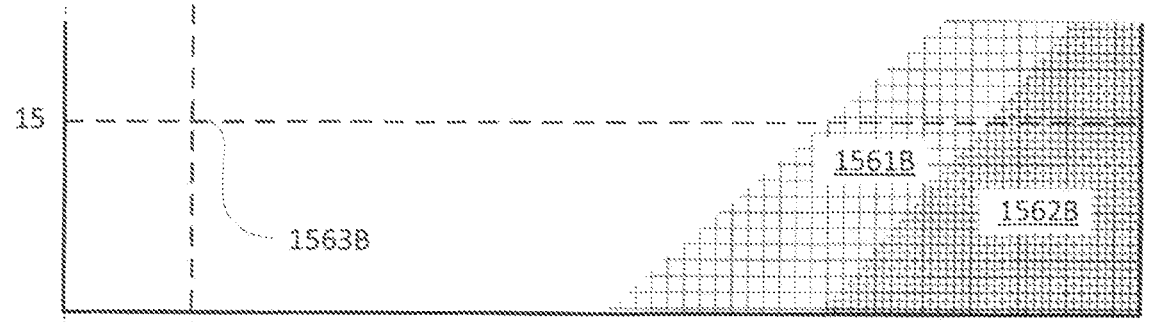
Figure 15C:
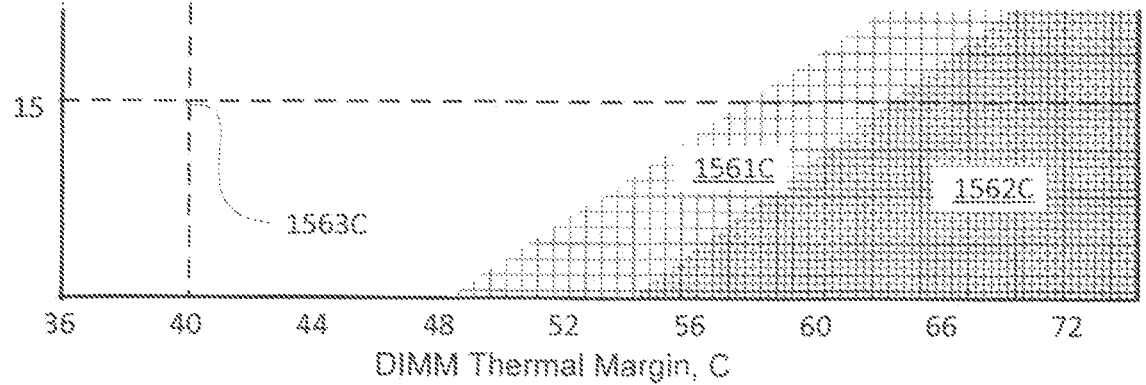

FIG. 15A-15C are data charts of thermal model results for the cooling system of FIG. 12B with the three alternative thermal transfer devices of FIGS. 14A-14C in one particular example. As mentioned above, the illustrated examples are memory boards loaded with DIMMs. Each of the data charts graph DIMM power consumption versus DIMM operating thermal margin. The points 1563A, 1563B, and 1563C represent design operating points. The regions 1561A, 1561B, and 1561C are the regions of operation where the operation is nearing the limit to stay within specification. The regions 1562A, 1562B and 1562C are the regions in which operation excess the limit to stay within specification.

This concludes the detailed description. The particular examples disclosed above are illustrative only, as the technique disclosed herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the appended claims. Accordingly, the protection sought herein is as set forth in the claims below.

What is claimed is:

1. A thermal transfer assembly, comprising:
    a thermal transfer jacket; and
    a cooling frame with which the thermal transfer jacket is mechanically engaged and to which the thermal transfer jacket is thermally coupled, the cooling frame defining:
        an interior framed space into which at least a portion of the thermal transfer jacket is disposed; and
        a coolant channel including at least one turbulence enhancing artifact to intentionally enhance a turbulence into a liquid flow through the coolant channel
    wherein the cooling frame comprises a first end block, a second end block opposite the first end block, an inbound side-rail extending between first and second end blocks, and an out-bound side rail extending between the first and second end blocks,
    wherein the interior framed space is defined between the first and second end blocks and between the inbound and outbound side-rails, and
    wherein the coolant channel extends from an inlet into a first portion of the first end block, from the first portion of the first end block into the inbound side-rail, from the inbound side-rail into the second end block, from the second end block into the out-bound side rail, from the out-bound side rail into a second portion of the first end block, and from the second portion of the first end block into an outlet.

2. The thermal transfer assembly of claim 1,
    wherein the inlet has having a circular cross-section;
    wherein the outlet has having the circular cross section; and
    wherein the coolant channel includes a portion between the inlet and the outlet having an oval cross-section.

3. The thermal transfer assembly of claim 2, wherein:
    the portion of the coolant channel between the inlet and the outlet includes the at least one turbulence enhancing artifact of the coolant channel; and
    the at least one turbulence enhancing artifact further includes bends and shape changes to further enhance the turbulence of the liquid flow through the coolant channel.

4. The thermal transfer assembly of claim 2, wherein the portion of the coolant channel between the inlet and the outlet includes:
    a first end block channel in the first portion of the first end block and fluidly connected to the inlet;
    a second end block channel in the second end block
    a third end block channel in the second portion of the first end block and fluidly connected to the outlet;
    an inbound side-rail channel in the inbound side-rail and fluidly continuous with the first end block channel and the second end block channel; and
    an outbound side-rail channel in the outbound side-rail and fluidly continuous with the second end block channel and the outbound third end block channel.

5. The thermal transfer assembly of claim 1, wherein the thermal transfer jacket includes:
    a first cover defining a first pair of tabs by which the thermal transfer jacket is mechanically engaged and thermally coupled to the cooling frame;
    a second cover opposed to and mechanically engaged with the first cover defining a second pair of tabs by which the thermal transfer jacket is mechanically engaged and thermally coupled to the cooling frame; and
    a first living spring integral to the first cover.

6. The thermal transfer assembly of claim 5, wherein the thermal transfer jacket further includes a second living spring integral to the second cover.

7. The thermal transfer assembly of claim 1, further comprising a thermal transfer device thermally coupled to the thermal transfer jacket and to the cooling frame.

8. The thermal transfer assembly of claim 7, wherein the thermal transfer device is a heat spreader.

9. A compute subassembly, comprising:
    a printed circuit assembly, including:
        a printed circuit board; and
        a plurality of electronic components mounted to the printed circuit board;
    a thermal transfer assembly, comprising:
        a thermal transfer jacket encasing and mechanically engaging the printed circuit assembly and thermally coupled to the printed circuit assembly; and
        a cooling frame with which the thermal transfer jacket is mechanically engaged and to which the thermal transfer jacket and the printed circuit assembly are thermally coupled, the cooling frame defining:
            an interior framed space into which at least a portion of the thermal transfer jacket is disposed; and
            a coolant channel including at least one turbulence enhancing artifact to intentionally introduce a turbulence into a liquid flow through the coolant channel,
    wherein the cooling frame comprises a first end block, a second end block opposite the first end block, an inbound side-rail extending between first and second end blocks, and an out-bound side rail extending between the first and second end blocks,
    wherein the interior framed space is defined between the first and second end blocks and between the inbound and outbound side-rails, and
    the coolant channel extends from an inlet into a first portion of the first end block, from the first portion of the first end block into the inbound side-rail, from the inbound side-rail into the second end block, from the second end block into the out-bound side rail, from the out-bound side rail into a second portion of the first end block, and from the second portion of the first end block into an outlet.

10. The compute subassembly of claim 9, wherein the printed circuit assembly is a memory board.

11. The compute subassembly of claim 9, wherein the electronic components include a plurality of Dual In-line Memory Modules ("DIMMs").

12. The compute subassembly of claim 9, wherein the coolant channel includes:
an inlet having a circular cross-section;
an outlet having the circular cross section; and
a portion between the inlet and the outlet having an oval cross-section.

13. The compute subassembly of claim 12, wherein:
the portion includes the at least one turbulence enhancing artifact of the coolant channel; and
the at least one turbulence enhancing artifact includes bends and shape changes to enhance a turbulence of a liquid flowing through the coolant channel.

14. The compute subassembly of claim 9, wherein the thermal transfer jacket includes:
a first cover, the first cover:
defining a first pair of tabs by which the thermal transfer jacket is mechanically engaged and thermally coupled to the cooling frame;
thermally coupling the printed circuit assembly to the cooling frame; and
covering at least a first portion of a first side of the printed circuit assembly;
a second cover opposed to and mechanically engaged with the first cover and:
defining a second pair of tabs by which the thermal transfer jacket is mechanically engaged and thermally coupled to the cooling frame;
thermally coupling the printed circuit assembly to the cooling frame; and
covering at least a second portion of a second side of the printed circuit assembly; and
a first living spring integral to the first cover, the first living spring compressed against a first component of the plurality of electronic components mounted to the printed circuit assembly by the engagement of the first cover and the second cover to mechanically engage the first cover with the printed circuit assembly to:
mechanically engage the thermal transfer jacket with the printed circuit assembly; and
thermally couple the printed circuit assembly to the thermal transfer jacket and the cooling frame.

15. The compute subassembly of claim 9, further comprising a thermal transfer device thermally coupled to the thermal transfer jacket and to the cooling frame.

16. The compute subassembly of claim 15, wherein the thermal transfer device is thermally coupled to the thermal transfer jacket through mechanical engagement.

17. The compute subassembly of claim 15, wherein the thermal transfer device is a heat spreader.

18. A compute system, comprising:
a first printed circuit board comprising a socket; and
the compute subassembly of claim 9, wherein the
cooling frame is mounted to the first printed circuit board such that the interior framed space encompasses the socket, and
the printed circuitry assembly is mechanically and electrically engaged to the socket of the first printed circuit board within the interior framed space.

19. The compute system of claim 18,
wherein the printed circuit board has length, width, and thickness dimensions and comprises:
a first face parallel to the length and width dimensions,
a second face parallel to and opposite the first face,
an edge connecting the first and second faces, and
an edge connector at the edge configured to communicably connect the printed circuit assembly to another electronic device;
wherein the thermal transfer jacket comprises a first cover extending along and mechanically and thermally coupled to a first side of the printed circuit assembly comprising the first face and a second cover extending along and mechanically and thermally coupled to a second side of the printed circuit assembly comprising the second face;
wherein the first cover, the second cover, or both the first and second covers comprise living springs integral to the first cover and/or the second cover, wherein each of the living springs is urged by a spring force towards the printed circuit assembly to contact the printed circuit assembly and thermally couple the printed circuit assembly with the thermal transfer jacket.

20. The compute system of claim 19,
wherein the first cover and the second cover define a pair of tabs positioned at opposite ends of the thermal transfer jacket relative to the length dimension of the printed circuit board,
wherein one of the tabs is mechanically engaged and thermally coupled with the first end block and the other of the tabs is mechanically engaged and thermally coupled with the second end block.

* * * * *